United States Patent
Korsh et al.

(10) Patent No.: US 6,396,742 B1
(45) Date of Patent: May 28, 2002

(54) TESTING OF MULTILEVEL SEMICONDUCTOR MEMORY

(75) Inventors: George J. Korsh, Redwood City; Sakhawat M. Khan, Los Altos; Hieu Van Tran, San Jose, all of CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/627,917

(22) Filed: Jul. 28, 2000

(51) Int. Cl.[7] .............................................. G11C 16/04
(52) U.S. Cl. ........................... 365/185.22; 365/185.03; 365/185.18; 365/185.29
(58) Field of Search ........................ 365/185.03, 201, 365/185.29, 185.22, 185.18

(56) References Cited

U.S. PATENT DOCUMENTS

| | | | |
|---|---|---|---|
| 4,054,864 A | 10/1977 | Audaire et al. | 340/173 R |
| 4,181,980 A | 1/1980 | McCoy | 365/45 |
| 4,415,992 A | 11/1983 | Adlhoch | 365/94 |
| 4,448,400 A | 5/1984 | Harari | 365/185 |
| 4,612,629 A | 9/1986 | Harari | 365/185 |
| 4,622,656 A | 11/1986 | Kamiya et al. | 365/185 |
| 4,627,027 A | 12/1986 | Rai et al. | 365/45 |
| 4,667,217 A | 5/1987 | Janning | 357/54 |
| 4,771,404 A | 9/1988 | Mano et al. | 365/189 |
| 4,794,565 A * | 12/1988 | Wu et al. | 365/185.01 |
| 4,890,259 A | 12/1989 | Simko | 365/45 |
| 4,989,179 A | 1/1991 | Simko | 365/45 |
| 5,029,130 A | 7/1991 | Yeh | 365/185 |
| 5,042,009 A | 8/1991 | Kazerounian et al. | 365/185 |
| 5,043,940 A | 8/1991 | Harari | 365/168 |
| 5,119,330 A | 6/1992 | Tanagawa | 365/168 |
| 5,150,327 A | 9/1992 | Matsushima et al. | 365/189.01 |
| 5,172,338 A | 12/1992 | Mehrotra et al. | 365/185 |
| 5,198,380 A | 3/1993 | Harari | 437/43 |
| 5,218,569 A | 6/1993 | Banks | 365/189.01 |
| 5,218,571 A | 6/1993 | Norris | 365/189.09 |
| 5,220,531 A | 6/1993 | Blyth et al. | 365/189.07 |
| 5,222,047 A | 6/1993 | Matsuda et al. | 365/230.03 |
| 5,241,494 A | 8/1993 | Blyth et al. | 365/45 |
| 5,243,239 A | 9/1993 | Khan et al. | 307/521 |
| 5,258,759 A | 11/1993 | Cauwenberghs et al. | 341/150 |
| 5,258,949 A | 11/1993 | Chang et al. | 365/185 |

(List continued on next page.)

FOREIGN PATENT DOCUMENTS

| | | |
|---|---|---|
| JP | 10-214494 | 8/1998 |
| WO | WO 90/12400 | 10/1990 |
| WO | WO 95/20224 | 7/1995 |
| WO | WO 96/04658 | 2/1996 |
| WO | WO 97/13250 | 4/1997 |
| WO | WO 98/08337 | 2/1998 |

OTHER PUBLICATIONS

"Japanese develop nondestructive analog semiconductor memory," *Electronics*, Jul. 11, 1974, pp. 29–30.

(List continued on next page.)

*Primary Examiner*—Son T. Dinh
(74) *Attorney, Agent, or Firm*—Gray Cary Ware & Freidenrich LLP

(57) ABSTRACT

In accordance with an embodiment of the present invention, a method for testing a multilevel memory includes: performing an erase operation to place a plurality of memory cells in an erased state; programming a state of each cell in a group of the plurality of cells to within a first range of voltages; if a state of each of one or more of the cells in the group of cells does not verify to within the first range of voltages, identifying at least the one or more cells as failing; and if a state of each cell in the group of cells verifies to within the first range of voltages: applying a predetermined number of programming pulses to further program the state of each cell in the group of cells to within a second range of voltages; and verifying whether a state of each cell in the group of cells is programmed beyond the second range of voltages.

148 Claims, 12 Drawing Sheets

U.S. PATENT DOCUMENTS

| | | | |
|---|---|---|---|
| 5,268,870 A | 12/1993 | Harari | 365/185 |
| 5,283,761 A | 2/1994 | Gillingham | 365/189.07 |
| 5,293,560 A | 3/1994 | Harari | 365/185 |
| 5,294,819 A | 3/1994 | Simko | 257/314 |
| 5,297,096 A | 3/1994 | Terada et al. | 365/218 |
| 5,313,421 A | 5/1994 | Guterman et al. | 365/185.11 |
| 5,336,936 A | 8/1994 | Allen et al. | 307/201 |
| 5,352,934 A | 10/1994 | Khan | 307/296.1 |
| 5,357,476 A | 10/1994 | Kuo et al. | 365/185.12 |
| 5,365,486 A | 11/1994 | Schreck | 365/222 |
| 5,371,031 A | 12/1994 | Gill et al. | 438/264 |
| 5,388,064 A | 2/1995 | Khan | 365/45 |
| 5,394,362 A | 2/1995 | Banks | 365/189.01 |
| 5,412,601 A | 5/1995 | Sawada et al. | 365/185 |
| 5,422,842 A | 6/1995 | Cernea et al. | 365/185 |
| 5,440,505 A | 8/1995 | Fazio et al. | 365/45 |
| 5,440,518 A | 8/1995 | Hazani | 365/218 |
| 5,475,634 A | 12/1995 | Wang et al. | 365/185.17 |
| 5,477,499 A | 12/1995 | Van Buskirk et al. | 365/218 |
| 5,479,170 A | 12/1995 | Cauwenberghs et al. | 341/200 |
| 5,485,422 A | 1/1996 | Bauer et al. | 365/168 |
| 5,487,033 A | 1/1996 | Keeney et al. | 365/185.19 |
| 5,508,958 A | 4/1996 | Fazio et al. | 365/185.19 |
| 5,511,020 A | 4/1996 | Hu et al. | 365/185.28 |
| 5,521,865 A | 5/1996 | Ohuchi et al. | 365/185.03 |
| 5,521,878 A | 5/1996 | Ohtani et al. | 365/189.05 |
| 5,523,972 A | 6/1996 | Rashid et al. | 365/185.22 |
| 5,539,690 A | 7/1996 | Talreja et al. | 365/185.22 |
| 5,546,341 A | 8/1996 | Suh et al. | 365/185.33 |
| 5,555,519 A | 9/1996 | Takashima et al. | 365/63 |
| 5,566,111 A | 10/1996 | Choi | 365/185.22 |
| 5,566,125 A | 10/1996 | Fazio et al. | 365/45 |
| 5,590,076 A | 12/1996 | Haddad et al. | 365/185.25 |
| 5,592,415 A | 1/1997 | Kato et al. | 365/185.01 |
| 5,615,159 A | 3/1997 | Roohparvar | 365/201 |
| 5,615,163 A | 3/1997 | Sakui et al. | 365/230.3 |
| 5,627,784 A | 5/1997 | Roohparvar | 365/189.01 |
| 5,629,890 A | 5/1997 | Engh | 365/185.03 |
| 5,633,822 A | 5/1997 | Campardo et al. | 365/185.03 |
| 5,652,450 A | 7/1997 | Hirano | 257/323 |
| 5,657,332 A | 8/1997 | Auclair et al. | 371/40.11 |
| 5,663,923 A | 9/1997 | Baltar et al. | 365/230.03 |
| 5,671,176 A | 9/1997 | Jang et al. | 365/185.02 |
| 5,677,885 A | 10/1997 | Roohparvar | 365/201 |
| 5,687,114 A | 11/1997 | Khan | 365/185.03 |
| 5,694,356 A | 12/1997 | Wong et al. | 365/185.03 |
| 5,708,620 A | 1/1998 | Jeong | 365/230.06 |
| 5,712,815 A | 1/1998 | Bill et al. | 365/185.03 |
| 5,761,109 A | 6/1998 | Takashima et al. | 365/63 |
| 5,761,117 A | 6/1998 | Uchino et al. | 365/185.03 |
| 5,764,586 A | 6/1998 | Vanco et al. | 365/230.06 |
| 5,801,989 A | 9/1998 | Lee et al. | 365/185.22 |
| 5,896,340 A | 4/1999 | Wong et al. | 365/230.03 |
| 5,969,987 A | 10/1999 | Blyth et al. | 365/185.03 |
| 5,973,956 A | 10/1999 | Blyth et al. | 365/185.03 |

OTHER PUBLICATIONS

Heald et al., "Multilevel Random–Access Memory Using One Transistor Per Cell," *IEEE J. Solid–State Circuits* (1976) SC–11:519–528.

Alberts et al., "Multi–Bit Storage FET EAROM Cell," *IBM Tech. Disclosure Bulletin* (1981) 24:3311–3314.

Eitan et al., "Hot–Electron Injection into the Oxide in n–Channel MOS Devices," *IEEE Transactions on Electron Devices* (1981) ED–28:328–340.

Kamiya et al., "EPROM Cell with High Gate Injection Efficiency," *IEDM 82* (1982) pp. 741–744.

Tam et al., "Lucky–Electron Model of Channel Hot–Electron Injection in MOSFET's," *IEEE Transactions on Electron Devices* (1984) ED–31:1116–1125.

Baglee et al., "The Effects of Write/Erase Cycling on Data Loss in EEPROMs," *IEDM*, Dec. 1–4, 1985, pp. 624–626.

Bleiker et al., "A Four–State EEPROM Using Floating–Gate Memory Cells," *IEEE J. Solid–State Circuits* (1987) SC–22:357–360.

Verma et al., "Reliability Performance of ETOX Based Flash Memories," 1988 IEEE International Reliability Physics Symposium, Apr. 11–13, 1988, pp. 158–166.

Naruke et al., "Stress Induced Leakage Current Limiting to Scale Down EEPROM Tunnel Oxide Thickness," *IEDM*, Dec. 11–14, 1988, pp. 424–427.

Horiguchi et al., "An Experimental Large–Capacity Semiconductor File Memory Using 16–Levels/Cell Storage," *IEEE J. Solid–State Circuits* (1988) 23:27–33.

Furuyama et al., "An experimental 2–bit/cell storage DRAM for macro cell or memory–on–logic application," IEEE 1988 Custom Integrated Circuits Conference, pp. 4.4.1–4.4.4.

Kirisawa et al., "A NAND Structured Cell with a New Programming Technology for Highly Reliable 5V–only Flash EEPROM," 1990 Symposium on VLSI Technology, Jun. 4–7, 1990, pp. 129–130.

Blyth et al., "A Non–Volatile Analog Storage Device Using EEPROM Technology," 1991 IEEE International Solid–State Circuits Conference, pp. 192–193 & 315.

Goodenough, "IC Holds 16 Seconds of Audio Without Power," *Electronic Design*, Jan. 31, 1991, pp. 39–44.

Horio et al., "Analog Memories for VLSI Neurocomputing," *Analog Memory*, Paper 2.21, pp. 344–363.

Onoda et al., "A Novel Cell Structure Suitable for a 3 Volt Operation, Sector Erase Flash Memory," *IEDM*, Dec. 13–16, 1992, pp. 599–602.

Bergemont et al., "NOR Virtual Ground (NVG)—A New Scaling Concept for Very High Density Flash EEPROM and Its Implementation in a 0.5μm Process," *IEDM*, Dec. 3–8, 1993, pp. 15–18.

Ong et al., "Erratic Erase in ETOX Flash Memory Array," 1993 VLSI Symposium on Technology, May 17–19, 1993, pp. 83–84.

Kobayashi et al., "Memory Array Architecture and Decoding Scheme for 3 V Only Sector Erasable Dinor Flash Memory," *IEEE J. Solid–State Circuits* (1994) 29:454–460.

Kato et al., "Read–Disturb Degradation Mechanism due to Electron Trapping in the Tunnel Oxide for Low–Voltage Flash Memories," *IEDM*, Dec. 11–14, 1994, pp. 45–48.

Peng et al., "Flash EPROM Endurance Simulation Using Physics–Based Models," *IEDM*, Dec. 11–14, 1994, pp. 295–298.

Cappelletti et al., "Failure Mechanisms of Flahs Cell in Program/Erase Cycling," *IEDM*, Dec. 11–14, 1994, pp. 291–294.

Ria Au et al., "Neuron–MOS Multiple–Valued Memory Technology for Intelligent Data Processing," 1994 IEEE International Solid–State Circuits Conference, pp. 270–271 & 351.

Kim et al., "A Novel Dual String NOR (DuSNOR) Memory Cell Technology Scalable to the 256 Mbit and 6 Gbit Flash Memories," *IEDM*, Dec. 10–13, 1995, pp. 263–266.

Yamauchi et al., "A New Cell Structure for Sub–quarter Micron High Density Flash Memory," *IEDM*, Dec. 10–13, 1995, pp. 267–270.

Van Houdt et al., "An Analytical Model for the Optimization of Source–Side Injection Flash EEPROM Devices," *IEEE Transactions on Electron Devices* (1995) 42:1314–1320.

Bauer et al., "A Multilevel Cell 32Mb Flash Memory," 1995 IEEE ISSCC., Feb. 16, 1995, pp. 132–133 & 351.

Atsumi et al., "A 16–Mb Flash EEPROM with a New Self–Data–Refresh Shceme for a Sector Erase Operation," *IEEE J. Solid–State Circuits* (1995) 29:461–469.

Shirota et al., "A New Programming method and Cell Architecture and for Multi–Level NAND FLASH Memories," The 14th Annual IEEE Nonvolatile Semiconductor Memory Workshop, Aug. 1995, Paper 2.7.

Jung et al., "A 3.3V 128Mb Multi–Level NAND Flash Memory for Mass Storage Applications," 1996 IEEE ISSCC., Feb. 8, 1996, pp. 32–33 & 412.

Ohkawa et al., "A 98mm 3.3V 64Mb Flash Memory with FN–NOR Type 4–level Cell," 1996 IEEE ISSCC, Feb. 8, 1996, pp. 36–37 & 413.

* cited by examiner

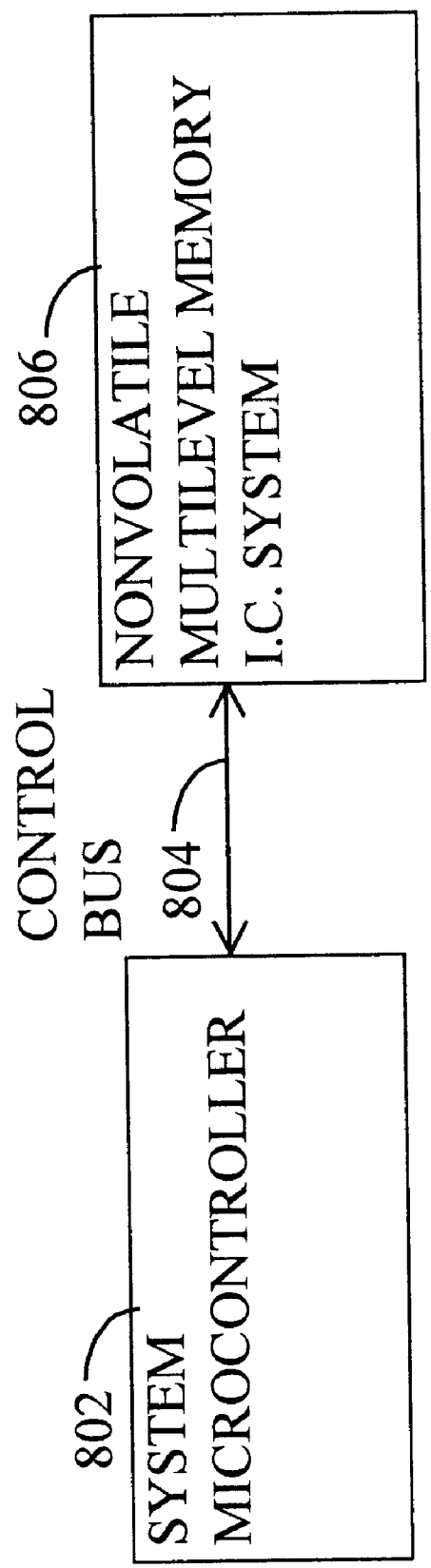
FIG._10

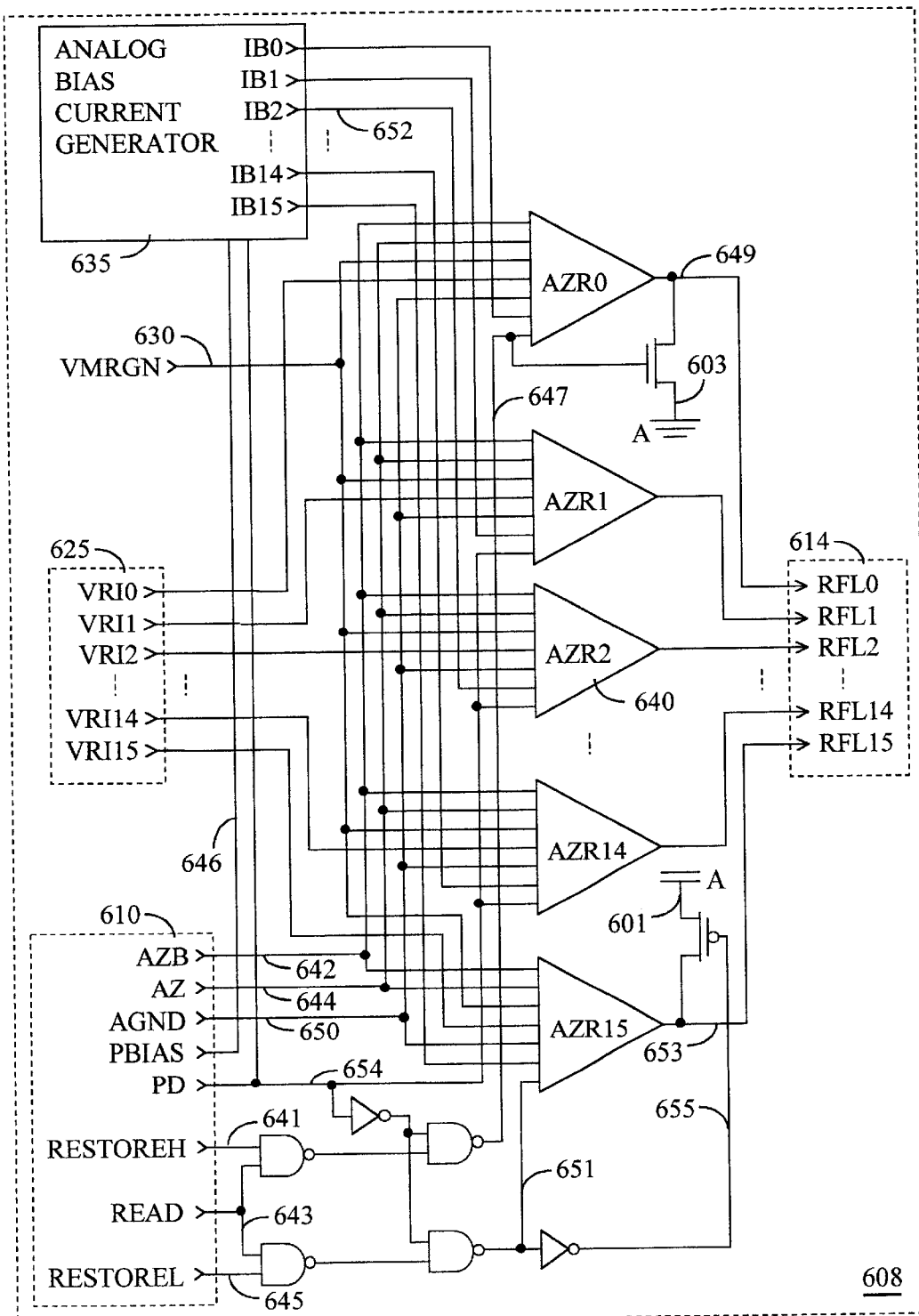
*FIG._11*

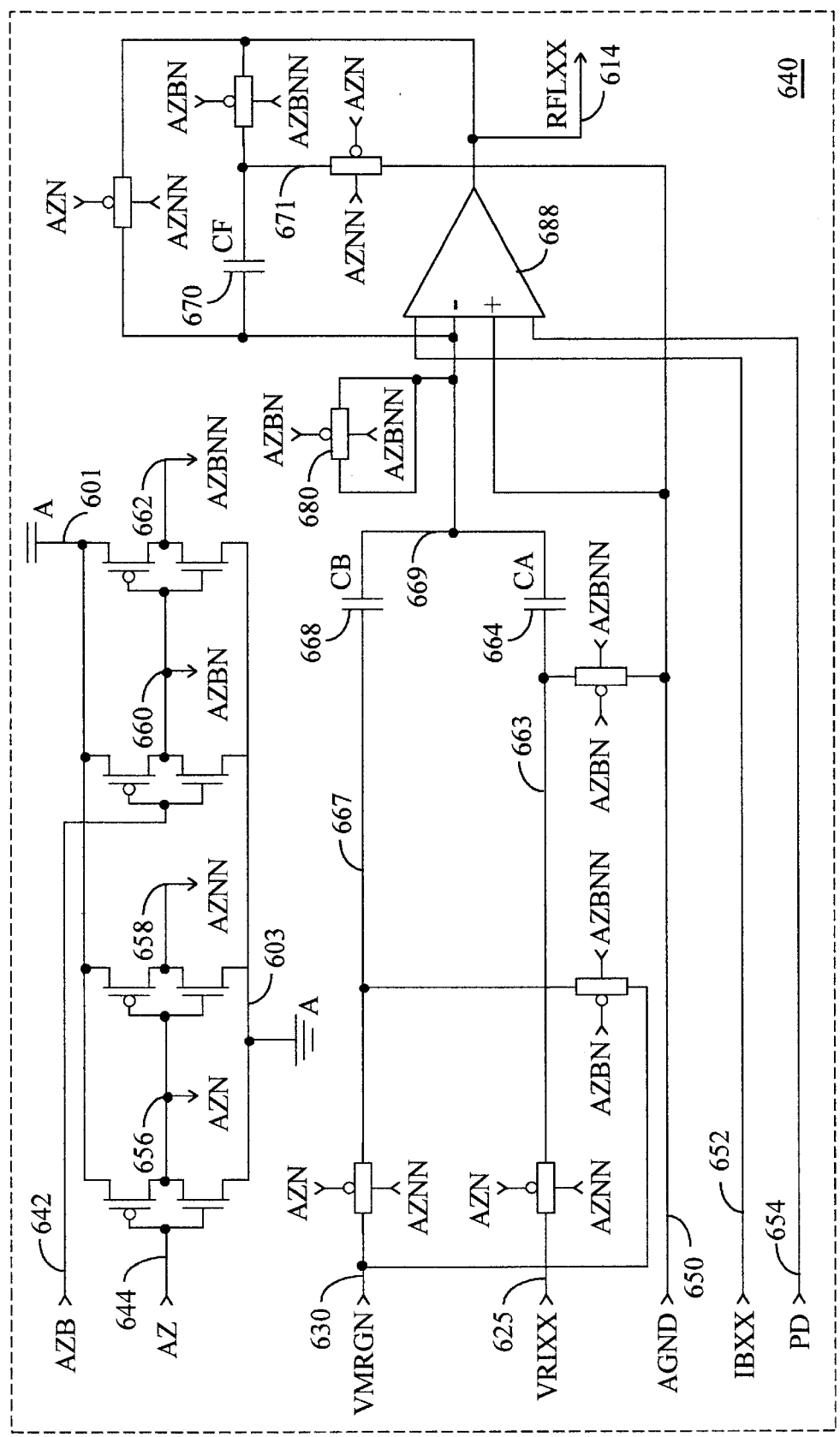
FIG_12

TESTING OF MULTILEVEL SEMICONDUCTOR MEMORY

FIELD OF THE INVENTION

This invention relates in general to semiconductor memories and, in particular, to the design, operation, and testing of multilevel nonvolatile semiconductor memories.

BACKGROUND OF THE INVENTION

Testing multilevel nonvolatile memories poses new problems which are not encountered in either single-bit per cell memories or in analog memory storage architectures.

A first problem deals with detecting and screening out cells which program more than intended. To obtain the programming precision required for multilevel cells, iterative programming algorithms have been used. These algorithms execute a verify step followed by a programming pulse step if necessary (a sensing step performed during a programming algorithm is called a verify step, while a sensing step performed subsequent to the programming algorithm forms part of a read operation). The verify program iteration is repeated until the desired charge storage level in the cell is reached with the required precision. During a programming iteration, the amount of charge in the cell is incremented in small amounts so as not to overshoot the desired level. The data stored will be incorrect if a cell programs too much and overshoots the desired level. The overshoot problem poses additional detection problems when the iterative programming algorithm (technique) is used. This will be described in more detail later.

A second problem encountered in multilevel nonvolatile memories is the ability to economically test whether each memory cell in a large array of cells arranged in rows and columns receives the proper control signals for reliable multilevel operation. For example, every column and row driver circuit needs to be efficiently tested for functionality and defects such as shorted or open rows or columns need to be efficiently detected. In single-bit per cell memory, a common way to determine whether the rows and columns of cells function properly is by using such conventional programming patterns as checkerboard data patterns.

The checkerboard data pattern refers to data programmed in physical cell locations such that each programmed cell has an erased cell on adjacent orthogonal row and column locations. Programmed cells are located on diagonal adjacent locations. Defect determination is made after the data is programmed. If the data subsequently read out of the chip fails to verify to the expected checkerboard data pattern, a defect is found.

In single-bit per cell memories, the functionality determination involves only two levels per cell (i.e., programmed data level and erased data level), and the use of the checkerboard pattern is quite appropriate. In multilevel memories however, the checkerboard data pattern is insufficient to determine if the array is fully functional since the data is not restricted to just 2 levels. In multilevel operation, each memory cell will contain $2^N$ levels of information, where N is the number of digital bits stored in each cell. In the examples used to describe different embodiments of this invention, 4 bits are stored per cell requiring 16 levels. Testing all 16 levels for each memory cell would fully test the multilevel functionality of the chip but would take too long and raise test and chip cost.

A third problem is the ability to properly test the cells' sensing margin. The sensing is partly accomplished by comparing a voltage value $V_R$ generated by the selected memory cell on a column to which it is coupled to a selected one of a plurality of reference voltage values. The sensing margin is defined as the difference between the $V_R$ value and the selected reference value. If the sensing margin becomes too small, the sensing circuits may not sense the data properly over the chip's specified operating temperature and power supply voltage ranges. In addition, during testing of a memory chip, voltage and/or temperature stress conditions are applied which may reduce the sensing margin in certain cells, thus allowing these cells to be identified as potentially unreliable. In multilevel memories, the separation between reference values become quite small for larger N values, e.g., for N>2. For instance, the separation between adjacent reference values which form the boundaries for each valid data range may be less than 100 mV for a 4-bit multilevel system (i.e., N=4,) but 400 mV for a 2-bit system for the same cell technology. Thus, the relatively small sensing margin for systems with N>2 requires special new testing techniques and circuitries.

Thus, new testing methodologies and circuit techniques will be described which address the above-identified problems as well as other problems encountered in testing multilevel nonvolatile memories. Also, new margin testing techniques which speed up multilevel cell testing will be described.

SUMMARY OF THE INVENTION

In accordance with an embodiment of the present invention, a method for testing a multilevel memory includes: performing an erase operation to place a plurality of memory cells in an erased state; programming a state of each cell in a group of the plurality of cells to within a first range of voltages; if a state of each of one or more of the cells in the group of cells does not verify to within the first range of voltages, identifying at least the one or more cells as failing; and if a state of each cell in the group of cells verifies to within the first range of voltages: applying a predetermined number of programming pulses to further program the state of each cell in the group of cells to within a second range of voltages; and verifying whether a state of each cell in the group of cells is programmed beyond the second range of voltages.

In another embodiment, the method further includes: if a state of each of one or more cells in the group of cells is programmed beyond the second range of voltages, identifying at least the one or more cells as failing.

In another embodiment, if a state of each cell in the group of cells verifies to within the first range of voltages, no verify operation is performed before or during the applying step.

In another embodiment, the first range and the second range are two of a plurality of sequentially defined voltage ranges which start with an initial range corresponding to the erased state, the first range being one of a first group of the plurality of sequentially defined voltage ranges substantially close to the initial range.

In another embodiment, each of the plurality of sequentially defined voltage ranges corresponds to one of a plurality of distributions of sensing voltages generated by the memory cells. Each of the plurality of sequentially defined voltage ranges is within a corresponding larger range of voltages, each larger range corresponding to one of $2^N$ binary combinations of N bits of data capable of being stored in each cell, wherein N is a positive integer. The larger ranges are non-overlapping.

In accordance with another embodiment of the present invention, a multilevel memory has an array of erased memory cells arranged along rows and columns, each cell being capable of storing N bits of data by setting a state of each cell to within one of $2^N$ voltage ranges, the cells along each row being divided into M groups, each of the M groups having a plurality of adjacent memory cells, N and M being integers greater than 1, wherein in a memory access one of a plurality of pages of memory cells in a row is selected, each page having M memory cells, one cell from each of the M groups of cells, a subset of each page of M memory cells comprising $2^N$ cells. A method for testing such a multilevel memory includes: programming a state of each cell in a first group of $2^N$ cells located along each column to a respective one of the $2^N$ voltage ranges; and programming a state of each cell in a second group of cells comprising the $2^N$ cells in the subset of a selected page along each row, each of the $2^N$ cells in the subset of the selected page along each row being programmed to a respective one of the $2^N$ voltage ranges.

In another embodiment, the method further includes: programming a state of each of $2^N$ reference cells along each row to a respective one of the $2^N$ voltage ranges; and comparing a state of each of the $2^N$ cells in the subset of the selected page along each row to a state of a corresponding one of the $2^N$ reference cells along the same row.

In another embodiment, each of the M groups of cells comprises K adjacent memory cells, there being K pages of memory cells along each row, and the method further includes: programming a state of each of the $2^N$ cells in the subset of each of the K pages along each row to a respective one of the $2^N$ voltage ranges.

In another embodiment, the multilevel memory further comprises K groups of reference cells along each row, each of the K groups of reference cells comprising $2^N$ reference cells, and the method further includes: programming a state of each of the $2^N$ reference cells in each of the K groups of reference cells along each row to a respective one of the $2^N$ voltage ranges; and comparing a state of each of the $2^N$ cells in each of the K subsets along each row to a state of a corresponding one of the $2^N$ reference cells in each of the K groups of reference cells along the same row.

In another embodiment, the first group of cells are located substantially along a first side of the array furthest from a column select circuit coupled to the columns, and the second group of cells are located substantially along a second side of the array furthest from a row select circuit coupled to the rows.

In accordance with another embodiment of the present invention a multilevel memory has an array of erased memory cells, each cell being capable of storing N bits of data by setting a state of the cell to within one of $2^N$ voltage ranges, each of the $2^N$ voltage ranges comprising a distribution voltage range and at least one margin voltage range, N being an integer greater than 1. A method of testing such multilevel memory includes: programming a state of each of a plurality of the memory cells to within the distribution voltage range of at least one of the $2^N$ voltage ranges; sensing the state of each of the plurality of programmed memory cells; and identifying any of the programmed memory cells whose state resides within the at least one margin voltage range, wherein a magnitude of the at least one margin voltage range is adjustable.

In another embodiment, the memory is an integrated circuit, and the method further includes: internally generating a plurality of predefined margin voltage values used to define a magnitude of the at least one margin voltage range of each of the $2^N$ voltage ranges; and externally selecting at least one of the plurality of predefined margin voltage values for defining a magnitude of at least one margin voltage range of at least one of the $2^N$ voltage ranges, wherein the internally generated plurality of predefined margin voltage values are adjustable.

In another embodiment, each of the $2^N$ voltage ranges comprises an upper margin voltage range and a lower-margin voltage range, and the method further includes: identifying any of the programmed memory cells whose state resides within either the upper-margin voltage range or the lower-margin voltage range, wherein the upper-margin voltage range and the lower-margin voltage range of each of the $2^N$ voltage ranges are adjustable.

In accordance with another embodiment of the present invention, a multilevel memory has an array of erased memory cells, each cell being capable of storing N bits of data by setting a state of the cell to within one of $2^N$ voltage ranges, each of the $2^N$ voltage ranges comprising a distribution voltage range and at least one margin voltage range, N being an integer greater than 1. A method of testing such multilevel memory including: setting the distribution voltage range of at least one of the $2^N$ voltage ranges to a smaller range than a corresponding distribution voltage range used during normal memory programming mode; programming a state of each of a plurality of the memory cells to within the distribution voltage range of the at least one of the $2^N$ voltage ranges; subjecting the plurality of programmed cells to stress conditions; and if a state of one or more of the programmed cells drifts a predetermined amount out of the smaller distribution voltage range, identifying the one or more of the programmed cells.

In another embodiment, the smaller distribution range is obtained by setting a magnitude of the at least one margin voltage range to be greater than a magnitude of the corresponding margin voltage range used during normal memory programming mode.

In another embodiment, the memory is an integrated circuit, and the predetermined amount corresponds to a tolerated-drift voltage range. The testing method further includes: internally generating a plurality of predefined tolerated-drift voltage values used to define a magnitude of the tolerated-drift voltage range of the at least one of the $2^N$ voltage ranges; and externally selecting at least one of the plurality of predefined tolerated-drift voltage values for defining a magnitude of the tolerated-drift voltage range of at least one of the $2^N$ voltage ranges.

In accordance with another embodiment of the present invention, a multilevel memory has an array of erased memory cells, each cell being capable of storing N bits of data by setting a state of the cell to within one of $2^N$ voltage ranges, N being an integer greater than 1. A method of testing such multilevel memory including: dividing the $2^N$ voltage ranges into at least a first group of one or more voltage ranges and a second group of one or more voltage ranges; programming a state of each of a plurality of the memory cells to within the second group of one or more voltage ranges; sensing the state of each of the plurality of programmed memory cells; and identifying any of the programmed memory cells whose state resides within the first group of one or more voltage ranges as failing.

In another embodiment, the $2^N$ voltage ranges are sequentially defined between a first voltage range corresponding to an erased state and a $2^N$ voltage range corresponding to a highest programmed state.

In another embodiment, the method further includes: generating a plurality of reference voltages for uniquely identifying each of the $2^N$ voltage ranges; and forcing all the plurality of reference voltages to be equal to a mid-reference voltage between the first voltage range and the $2^N$ voltage range.

In another embodiment, the method further includes: generating a mid-reference voltage, the mid-reference voltage being substantially near a center of the sequentially defined $2^N$ voltage ranges, voltage ranges above the mid-reference voltage corresponding to the first group of one or more voltage ranges, and voltage ranges below the mid-reference voltage corresponding to the second group of one or more voltage ranges.

In another embodiment, the method includes: generating a mid-reference voltage, the mid-reference voltage being substantially near the $2^N$ voltage range, voltage ranges above the mid-reference voltage corresponding to the first group of one or more voltage ranges, and voltage ranges below the mid-reference voltage corresponding to the second group of one or more voltage ranges.

In another embodiment, the method includes: generating a first reference voltage and a second reference voltage dividing the $2^N$ voltage ranges into three groups of voltage ranges, a first one of the three groups of voltage ranges corresponding to the first group of one or more voltage ranges and being between the first and second reference voltages, a second one of the three groups of voltage ranges corresponding to the second group of one or more voltage ranges and being below the second reference voltage, a third one of the three groups of voltage ranges being above the first reference voltage.

In another embodiment, the sensing step comprises N or more sensing cycles, and the method further includes: generating a plurality of reference voltages for uniquely identifying each of the $2^N$ voltage ranges; during a plurality of the N or more sensing cycles, forcing the plurality of reference voltages to be equal to a mid-reference voltage between the first voltage range and the $2^N$ voltage range; during one of a remaining sensing cycles, forcing one of the plurality of reference voltages to be equal to the first reference voltage; and during another of the remaining sensing cycles, forcing another of the plurality of reference voltages to be equal to the second reference voltage.

In accordance with another embodiment of the present invention, a multilevel memory includes: an array of memory cells each being capable of storing N bits of data by setting a state of the cell to within one of $2^N$ voltage ranges, N being an integer greater than 1; and a first circuit configured to receive a plurality of reference voltages and one of a plurality of predefined margin sensing voltages, the plurality of reference voltages uniquely identifying each of the $2^N$ voltage ranges, the first circuit performing an arithmetic operation on the reference voltages and the one of the plurality of predefined margin sensing voltages, and providing a modified plurality of reference voltages for use in sensing operations.

In another embodiment, the memory further includes: a reference voltage generator configured to generate the plurality of reference voltages; and a precision margin generator configured to generate the one of the plurality of predefined margin sensing voltage values.

In another embodiment, the reference voltage generator includes: a reference circuit for generating a first set of reference voltages; a plurality of reference memory cells for generating a second set of reference voltages; and a multiplexer for selecting one of the first and second sets of reference voltages as the plurality of reference voltages for transfer to the first circuit.

In another embodiment, the multiplexer is configured to force a predetermined number of the selected one of the first and second sets of reference voltages to a predetermined subset of the selected one of the first and second sets of reference voltages.

In accordance with another embodiment of the present invention, a multilevel memory includes: an array of memory cells each being capable of storing N bits of data by setting a state of the cell to within one of $2^N$ voltage ranges, N being an integer greater than 1; and a first circuit configured to receive a plurality of reference voltages uniquely identifying each of the $2^N$ voltage ranges, the first circuit being capable of reconfiguring the plurality of reference voltages to reduce the $2^N$ voltage ranges to less than $2^N$ ranges so that the storage capability of each cell is reduced from storing N bits.

In another embodiment, the multilevel memory is a nonvolatile memory and is an integrated circuit, each of the $2^N$ voltage ranges has a magnitude less than 150 mV, and N is greater than 2.

The circuits and testing methodologies of this invention can be used in the field to ensure the reliable operation of a multilevel memory system.

The following detailed description and the accompanying drawings provide a better understanding of the nature and advantages of the present invention.

BRIEF DESCRIPTION OF THE DRAWINGS

FIG. 10 shows an example of a system including a nonvolatile multilevel memory I.C. coupled via a control bus to a microcontroller capable of storing bad address, bad sector, or other parameter information in accordance with an embodiment of the present invention.

FIG. 11 is a circuit diagram showing the details of the PRECISION SUMMER circuit block 608 of FIG. 8 in accordance with one embodiment of the present invention.

FIG. 12 shows a circuit diagram of one of the switched capacitor summers AZRxx of FIG. 11 in accordance with a preferred embodiment of the present invention.

The use of the same reference symbols or numerals indicate similar or identical items.

DESCRIPTION OF THE SPECIFIC EMBODIMENTS

The present invention is related to U.S. Pat. No. 5,687,114 issued on Nov. 11, 1997 to Khan S., and U.S. Pat. No. 5,815,439 issued on Sep. 29, 1998 to Korsh et al., both of which are incorporated herein by reference.

In accordance with the present invention, built-in test modes that are transparent to the end user of a multilevel memory chip are used for testing the multilevel functionality of the memory chip. Another testing approach programs special data patterns into the chip to obtain test information efficiently and economically. Margin testing during sensing operation is used to determine the stability and reliability of the stored information as well as speed up testing. Voltage, current, and frequency values that are used by the chip internally can be read out and reconfigured as required. To improve manufacturing yields, redundant memory cells are used to replace those cells found to be defective or unreliable during testing. These memory test approaches and new combinations and improvements upon them, used to solve testing problems that are unique to multilevel chips, will be described.

Programming Overshoot and Aliasing Detection

Figure 1:
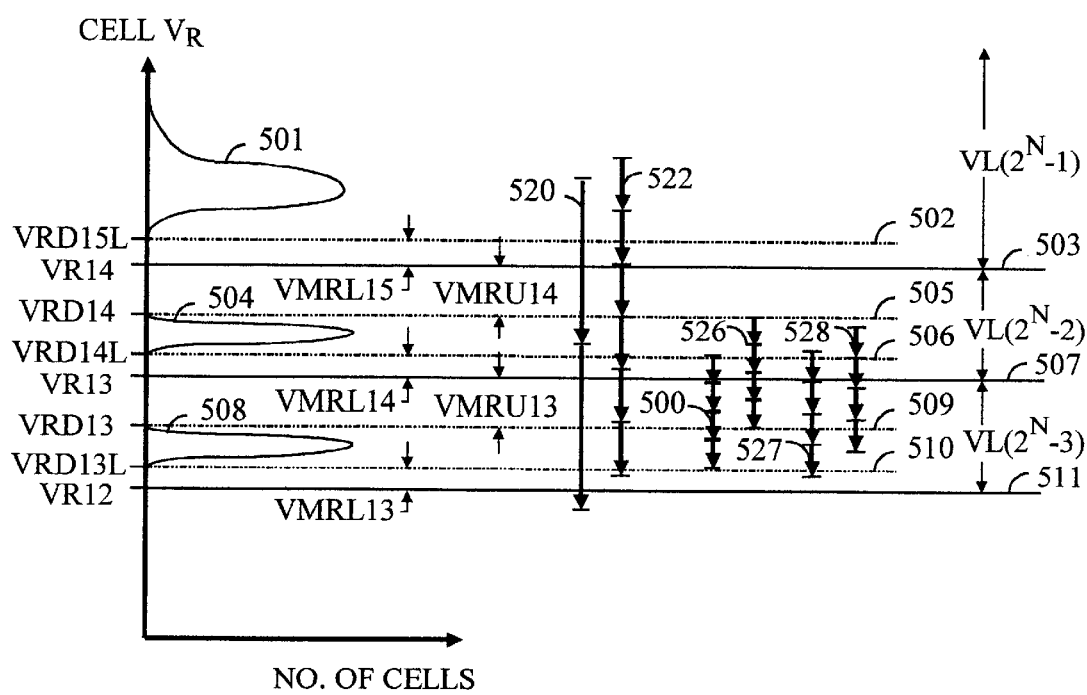
FIG. 1 shows three cell $V_R$ distributions and examples of $V_R$ shift used to describe programming overshoot and aliasing.

In accordance with the present invention, a new on-chip multilevel test mode circuit and methodology are used to detect cells which overshoot the desired programming level. The overshoot and aliasing problems as well as methodologies for detecting cells exhibiting these problems will be described with the aid of examples shown in FIGS. 1–3. The FIGS. 1–3 examples are for an N=4-bit per cell (or $2^N$=16 level) multilevel storage system. FIG. 1 shows the cell $V_R$ sensing voltage distribution of a plurality of cells in the memory chip in three voltage range levels, $VL(2^N-1)$, $VL(2^N-2)$, and $VL(2^N-3)$, corresponding to 4-bit input data 1111, 1110, and 1101, respectively. In this specification, the term level(s) is not used synonymously with the terms value, voltage, or signal. The term level is used to refer to a discrete range of voltages corresponding to one of the $2^N$ binary combinations of N bits of data stored in a multilevel cell. This input data assignment is only for convenience and is not intended to limit the scope of this invention. The three levels in FIG. 1 will be used to describe the problem of multilevel programming overshoot and aliasing. Then, several methods to detect cells with this problem during testing will be described.

In FIG. 1, an erased cell $V_R$ distribution 501 soon after erasure, consists of cells with $V_R$ above a reference voltage VRD15L, represented by a dotted and dashed line 502. Any cells sensed later with $V_R$ above a reference voltage VR14, represented by a solid line 503, will be sensed as being within level $VL(2^N-1)$. In this example, the erased cell distribution is used as a valid storage level assigned to memory system input signal data 1111. The cells in the erased level are shown as having higher $V_R$ than any of the cells in the programmed levels for illustration purposes only, and are not intended to limit the scope of the invention. The circuits and testing methodologies of the present invention are also applicable to multilevel memory systems wherein the cells in the erased level have lower $V_R$ than any of the cells in the programmed state. The difference between reference voltages VR14 and VRD15L defines an adequate lower margin VMRL15 for reliable data storage even if the $V_R$ drifts subsequent to the erase operation.

A first programmed cell $V_R$ distribution 504 consists of cells with $V_R$ between a reference voltage VRD14, represented by a dotted and dashed line 505 and a reference voltage VRD14L, represented by a dotted and dashed line 506. During normal read operation, cells with $V_R$ between reference voltage VR14 and a reference voltage VR13, represented by a solid line 507, will be read as being within level $VL(2^N-2)$. However, during verification soon after programming, the cells are tested to ensure that they are programmed to within the distribution range 504. In this manner, an adequate upper margin VMRU14 defined by the difference between references voltages VR14 and VRD14, and an adequate lower margin VMRL14 defined by the difference between reference voltages VR13 and VRD14L are provided to help maintain data integrity in case $V_R$ drifts subsequent to the programming operation.

A second programmed cell $V_R$ distribution 508, consists of cells with $V_R$ between a reference voltage VRD13, represented by a dotted and dashed line 509 and a reference voltage VRD13L, represented by a dotted and dashed line 510. During normal read operation, cells with $V_R$ between reference voltage VR13 and a reference voltage VR12, represented by a solid line 511, will be read as being within level $VL(2^N-3)$. However, during verification soon after programming, an adequate upper margin VMRU13 defined by the difference between reference voltages VR13 and VRD13, and an adequate lower margin VMRL13 defined by the difference between reference voltages VR12 and VRD13L are provided to help maintain data integrity in case $V_R$ drifts subsequent to the programming operation.

The programmed cell $V_R$ distributions 504 and 508 are respectively assigned to memory system data 1110 and 1101 for illustration purposes only and are not intended to limit the scope of the invention. Relevant to this invention is that the first programmed cell $V_R$ distribution 504 (level $VL(2^N-2)$) lays between the second programmed cell $V_R$ distribution 508 (level $VL(2^N-3)$) and the erased cell $V_R$ distribution 501 (level $VL(2^N-1)$). It is irrelevant which combination of the N bits of data is assigned to which distribution or level.

The problem of multilevel programming overshoot is described next using the FIG. 1 example. Any cell that programs more than intended by shifting its $V_R$ below its intended VRDxxL reference value, where xx is an integer between 0 and $(2^N-1)$ inclusive ($2^N$=16 in the example presented herein), is defined as a cell with a programming overshoot problem. Cells programmed to levels closest to the erased level are more likely to program more than intended than cells programmed to levels further away from the erased level. This is because the electric fields inside the cell tend to retard programming as the cell programs more. Thus, testing how the cells program from the erased level $VL(2^N-1)$ to the next lower level $VL(2^N-2)$ would identify cells with a gross overshoot problem. That is, any cell that fails to verify above VRD14L is identified as an overshoot failure. However, there is a problem with this overly simple test approach, which we shall examine in the cell programming examples described next.

FIG. 1 shows six examples of $V_R$ shifts in six different individual cells during a sequential portion of the iterative programming algorithm. Three short horizontal bars separated by two arrows represent a sequence of two $V_R$ shifts during two sequential programming iterations for a first example cell 520. Cell 520 initially starts out as an erased cell with $V_R$ just above the peak of the erased cell $V_R$ distribution 501. The first programming pulse of the iterative programming algorithm shifts the $V_R$ of cell 520 to the first programmed cell $V_R$ distribution 504. Assuming the desired data for this cell requires it to program within cell $V_R$ distribution 504, under ordinary programming operation the next verify step of the iterative programming algorithm detects that this cell has properly programmed in spite of the fact that it required only one programming iteration.

The multilevel programming aliasing problem is described next. Suppose the cell example 520 in FIG. 1 is erased again to the same previous erased $V_R$ and programmed this time to target cell $V_R$ distribution 508 instead of distribution 504. The cell example 520 this time takes two programming iterations. The first programming pulse shifts the $V_R$ the same amount as the previous case. The first verify detects the cell $V_R$ to be above reference voltage VRD13, and thus another programming pulse is applied. Assume the second programming pulse shifts the cell $V_R$ a similar amount as the first programming pulse. This assumption is reasonable because each of the two pulses cause a small enough shift in the cell $V_R$ so that the electric field conditions within the cell during the first and second programming pulses remain for the most part similar. The second programming pulse shifts the $V_R$ of cell 520 below VRD13L and thus beyond the desired target cell $V_R$ distribution 508. The example cell 520 programs too much and overshoots the desired cell $V_R$ distribution 508 in spite of being capable of programming to cell $V_R$ distribution 504 correctly. A test which only programs the cells in the memory array from the erased cell $V_R$ distribution 501 to the adjacent programmed cell $V_R$ distribution 504 would fail to detect the cell example 520 problem. The example cell 520 is a probable event when very large memory arrays are tested, and is an important test problem for multilevel cells.

When a cell passes programming verification to a first level but overshoots during programming to another level will be defined as a cell with a multilevel programming aliasing problem. The first cell example 520 programming correctly to cell $V_R$ distribution 504 but overshooting distribution 508 is an example of multilevel programming aliasing. Testing for programming overshoot on just one level is insufficient to catch the aliasing cells.

The previous example demonstrates single programming pulse aliasing. However, depending on how much the cell shifts during each programming pulse relative to the reference values, various other aliasing examples involving a plurality of programming iterations are encountered. For instance the cell may take three programming iterations to verify in level VL($2^N-2$) correctly and overshoot in level VL($2^N-3$) after three more programming iterations as shown by an example cell 522 in FIG. 1. Aliasing is also possible involving other combinations of levels besides the ones discussed in FIG. 1. One way to detect the aliasing problem cells is to program each cell in the memory to every possible level. But, an N-bit per cell memory would require $2^N$ separate erase and full chip programming tests which would take too much test time and increases chip cost prohibitively. Test time and cost would increase tremendously with increasing N (e.g., N>2).

A faster test method to detect overshoot and aliasing problems is described below and explained with the aid of another consideration during multilevel programming. That consideration is the requirement to achieve sufficient precision to be able to control the final placement of the cell's $V_R$ within any of the desired target programming distributions with adequate sensing margins for reliable operations as discussed earlier. One method to obtain the required precision is to ensure the cell's maximum $V_R$ shift during the final programming iteration is less than the programming distribution range for that targeted level. This maximum $V_R$ shift is defined as the programming resolution, $delV_R$. If we can insure the cell meets this programming resolution definition, then programming overshoot will not occur. This can be justified by observing that; 1) a cell initially programmed so that its $V_R$ is just barely above the desired target $V_R$ distribution range (i.e., $V_Ri$>VRDxx) would be required to get another programming pulse, and 2) if the maximum $V_R$ shift, $delV_R$, during the next programming pulse is less than the target $V_R$ programming distribution range (i.e., $delV_R$<(VRDxx–VRDxxL)), then 3) during the subsequent programming pulse the cell's $V_R$ can only decrease such that it is shifted within the desired target programming distribution range. Programming overshoot thus cannot occur (i.e., $V_R$=($V_Ri$–$delV_R$)>VRDxxL). To prevent the programming aliasing problem, the above resolution requirements need to be met for the $2^N$-programming levels of the cell.

In accordance with one embodiment of this invention, several conditions must be met in order to detect program aliasing simultaneously and to eliminate the need to test all $2^N$ levels. These conditions are: 1) use a programming algorithm designed so that each programming iteration produces about the same $delV_R$ shift and that does not exceed the width of the target programming distribution range for any programmed level (i.e., $delV_R$<(VRDxx–VRDxxL)); 2) each programming distribution range is designed to be about the same width (magnitude) for all levels (i.e., (VRDxx–VRDxxL) are all about equal); and 3) the reference voltage values for a predetermined number of programmed levels adjacent to the erased level are chosen about symmetrically, i.e., for these programmed levels, VRxx–VRDxx are about equal, VRDxx–VRDxxL are about equal, and VRxx–VR(xx–1) are about equal. These conditions are depicted in FIG. 1.

In one embodiment, detection of cells that exceed the desired programming level (i.e., cells with a programming aliasing problem) is accomplished in three test phases. Referring to FIG. 1. in the first phase, the cells to be tested are erased and the distribution of the cells is represented by cell $V_R$ distribution 501.

Next, in the second phase, the cells to be tested are programmed to the first programmed cell $V_R$ distribution 504 adjacent to the erased cell $V_R$ distribution 501. The cells that fail verification are cells with gross programming overshoot or other programming problems. Cells passing the test at this phase may still harbor programming aliasing problems similar to the example cells 520 and 522 shown in FIG. 1. However, the passing cells are now within a predetermined $V_R$ distribution that serves as a known starting point for the next phase.

In the third phase of the test, the cells passing the previous phase are forced to be programmed by a predetermined number of programming pulses, P, roughly equal to the result of dividing the width of the level, VL=VRxx–VR(xx–1), by the desired programming resolution, $delV_R$, that is, P=VL/$delV_R$.

The first and second phases are carried out in accordance with the normal iterative programming algorithms. During normal programming mode operation, the iterative programming algorithm will cause each cell's programming to stop at the iteration that verification is first reached. In the third phase however, using a special test mode, the normal iterative programming algorithm is superceded and a fixed number of programming pulses are forced without, or ignoring the result of, the verify operations that are normally carried out before each programming pulse. This will force cells with the programming aliasing problem to overshoot the next desired programming cell $V_R$ distribution (e.g., distribution 508) below the distribution 504 as explained in the examples below. Cells with the aliasing problem are thus detected as failures.

As an example, referring to FIG. 1, let us assume the levels VL are all about equal to 100 mV, each $V_R$ distribution (VRDxx–VRDxxL) after programming is about equal to 30 mV, and the desired $delV_R$ is about equal to 25 mV. Thus, about 100 mV/25 mV=4 programming pulses are applied to the cells being tested. This method is demonstrated in FIG. 1 by four cell examples. In a first cell example 500, five short horizontal bars separated by four arrows represent a sequence of four $V_R$ shifts during four sequential programming pulses. Cell 500 starts with initial $V_R$ at the VRD14L end of cell $V_R$ distribution 504, and shifts just within and at the VRD13L end of distribution 508 after four programming pulses. If this cell programmed more than the desired 25 mV resolution per pulse, it would be detected as overshooting the desired cell $V_R$ distribution 508 ($V_R$<VRD13L) and fail the test.

In a second cell example 526, five short horizontal bars separated by four arrows represent a sequence of four $V_R$ shifts during four sequential programming pulses. Cell 526 starts with initial $V_R$ at the VRD14 end of cell $V_R$ distribution 504, and after four programming pulses shifts outside the distribution 508, just above VRD13. This example cell 526 demonstrates that the strategy for verification in the third phase of this test needs to be modified from the normal verification operation mode. During a normal verify operation, cell 526 would need VRD13L<$V_R$<VRD13 to pass verify, and thus would fail verify. However, in the third phase test, we do not want to reject cells that program too slowly (like cell example 526) and fall short of the target cell $V_R$ distribution 508. Such slow to program cells may eventually verify correctly during the course of the normal iterative programming algorithm when more programming pulses are allowed. Thus, in this third phase test a special verify test mode is required to pass cells as long as their $V_R$ is greater than the VRDxxL of the target distribution (e.g., $V_R$>VRD13L in the cell example 526), and thus pass the slow to program cells.

There is another difference between normal programming mode and the special program overshoot and aliasing detection test mode. In normal program verify operation, once the cells in the page being programmed have passed verify, a signal can be generated to inform the on-chip logic state machine that programming has been completed and no further programming iterations are necessary. That signal can then release the chip to do other functions. However, because the third phase of the special program overshoot and aliasing test mode supersedes the normal programming mode, a signal is required to indicate whether one or more of the Y-DRIVERS in the page has failed to verify during phase three of that test. This feature of the present invention will later be described in more detail in connection with FIG. 5.

In a third cell example 527, five short horizontal bars separated by four arrows represent a sequence of four $V_R$ shifts during four sequential programming pulses. Note that cell 527 shifts a little more than the desired $delV_R$=25 mV after each programming pulse during phase three, and is also an example of a cell that can exhibit the program aliasing problem discussed earlier. Cell 527 is detected as overshooting since its $V_R$ after the four programming pulses in the third phase test is less than VRD13L. Once detected, this cell can be replaced with a healthy redundant cell or the chip can be tagged defective if insufficient redundant cells are left. These and other ways of dispositioning such cells are described in more detail later.

In a fourth cell example 528, five short horizontal bars separated by four arrows represent a sequence of four $V_R$ shifts during four sequential programming pulses. Cell 528 exhibits the same $delV_R$>25 mV behavior as cell 527 but differs by starting with an initial $V_R$ just below VRD14 instead of just above VRD14L. As shown, after the four programming pulses, the $V_R$ of cell 528 falls within distribution 508, and thus cell 528 escapes detection and passes the phase three test. This example demonstrates a problem with this method, namely, cells with $V_R$ starting at the VRD14 end of the first programmed cell $V_R$ distribution 504 can exceed the desired $delV_R$ by the width of the first distribution 504 divided by the number of programming pulses and still pass the test, that is, $delV_R$error=(VRD14–VRD14L)/P. In the example cell 528, the desired 25 mV resolution can be exceeded by as much as 30 mV/4=7.5 mV. The resulting 25 mV+7.5 mV=32.5 mV exceeds the desired 30 mV programming distribution range, and thus cells exhibiting such an aliasing problem will not be detected. This test inaccuracy can be minimized as described below.

There are several ways to reduce the test inaccuracy. They require reducing the ratio of the width of the first programmed cell $V_R$ distribution 504 divided by the number of programming pulses applied in the third phase. One way is to minimize the width of the first programming cell $V_R$ distribution 504. This can be accomplished via other test modes by reducing the programming drive to the cells and using a smaller $delV_R$ than the normal programming mode. Lowering voltage, current, or time programming parameters can accomplish smaller $delV_R$ via special programming test modes during phase two or three of the test. Increasing P will also reduce $delV_R$error. These improvements are applied to the examples shown in FIG. 2.

Figure 2:
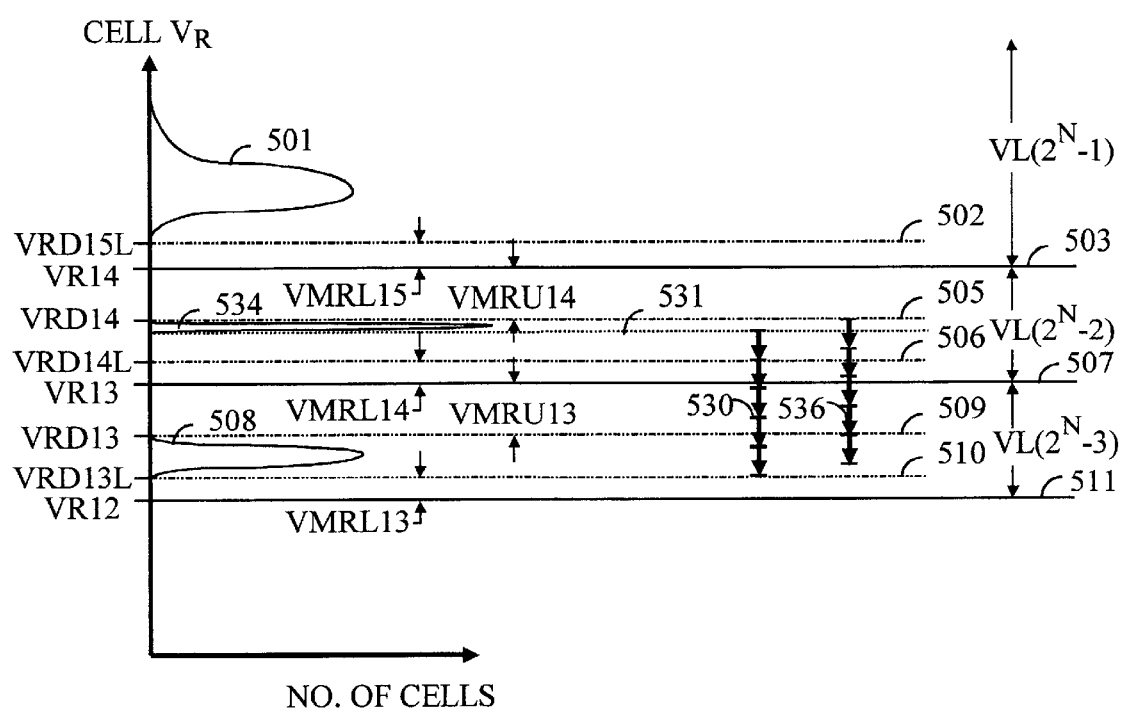
FIG. 2 shows three cell $V_R$ distributions and examples of $V_R$ shift used to describe an embodiment of the present invention utilizing a first programmed cell $V_R$ distribution spanning a smaller cell $V_R$ distribution range to reduce programming overshoot and aliasing detection error.

FIG. 2 is similar to FIG. 1 but shows a first programmed cell $V_R$ distribution 534 spanning a smaller $V_R$ range than the distribution after phase two of the test method. Each of the cells programmed to within cell $V_R$ distribution 534 has a $V_R$ located between VRD14 and a $V_R$ value 531, which is between VRD14 and VRD14L. In this example, a more general expression for the phase three programming pulse count is given by P={VL+($V_R$ value 531–VRD14L)}/$delV_R$. The more general expression for $delV_R$error={(VRD14–VRD14L)–($V_R$ value 531–VRD14L)}/P=(VRD14–$V_R$ value 531)/P. Note that as $V_R$ value 531 approaches VRD14L, the general expression agrees with the simpler formulas described earlier. To increase P (and reduce $delV_R$error), $delV_R$ can be reduced below the normal programming value by reducing the programming parameters as described above.

Thus, as an example, if $delV_R$ is reduced from 25 to 24 mV, and ($V_R$ value 531–VRD14L)=20 mV, then P=(100 mV+20 mV)/24 mV=5. This example requires the width of cell $V_R$ distribution 534 to be (VRD14–VRD14L)–($V_R$ value 531–VRD14L)=30 mV–20 mV=10 mV, which is still a practical value. The $delV_R$error is now reduced to only 10 mV/5=2 mV, which is below the value of practical consideration for this example. In the FIG. 2 cell examples 530 and 536, six short horizontal bars separated by five arrows represent a sequence of five $V_R$ shifts during five sequential programming pulses. The difference between the final $V_R$ values of cells 530 and 536 graphically shows that the del$V_R$error is much smaller now than the corresponding difference between cells 500 and 526 in FIG. 1. Alternatively, del$V_R$ can be kept unchanged at 25 mV, P=5, and the width of cell $V_R$ distribution 534 reduced to 5 mV to achieve a further reduced del$V_R$error=1 mV but at the expense of longer programming time during phase two.

Another way to reduce the del$V_R$error without having to change del$V_R$ and without having to reduce the width of the first programmed cell $V_R$ distribution 504 is to just increase P during phase three. This can be accomplished by shifting the cell through a plurality of levels, Z, during phase three of the test. Z depends on the desired del$V_R$error and can be determined using P=Z×VL/del$V_R$. For instance, if we increase P to 12 and keep the $V_R$ distributions after programming at 30 mV, the del$V_R$error is reduced to 30 mV/12=3.75 mV. Del$V_R$error is acceptable if (del$V_R$+del$V_R$error)<(VRDxx−VRDxxL). If del$V_R$ can be kept to the same 25 mV value as before, then 25 mV+3.75 mV=28.75 mV<30 mV and the del$V_R$error is acceptable. Then Z=P×del$V_R$/VL=12×25 mV/100 mV=3 levels. An example of this method is shown in FIG. 3.

Figure 3:
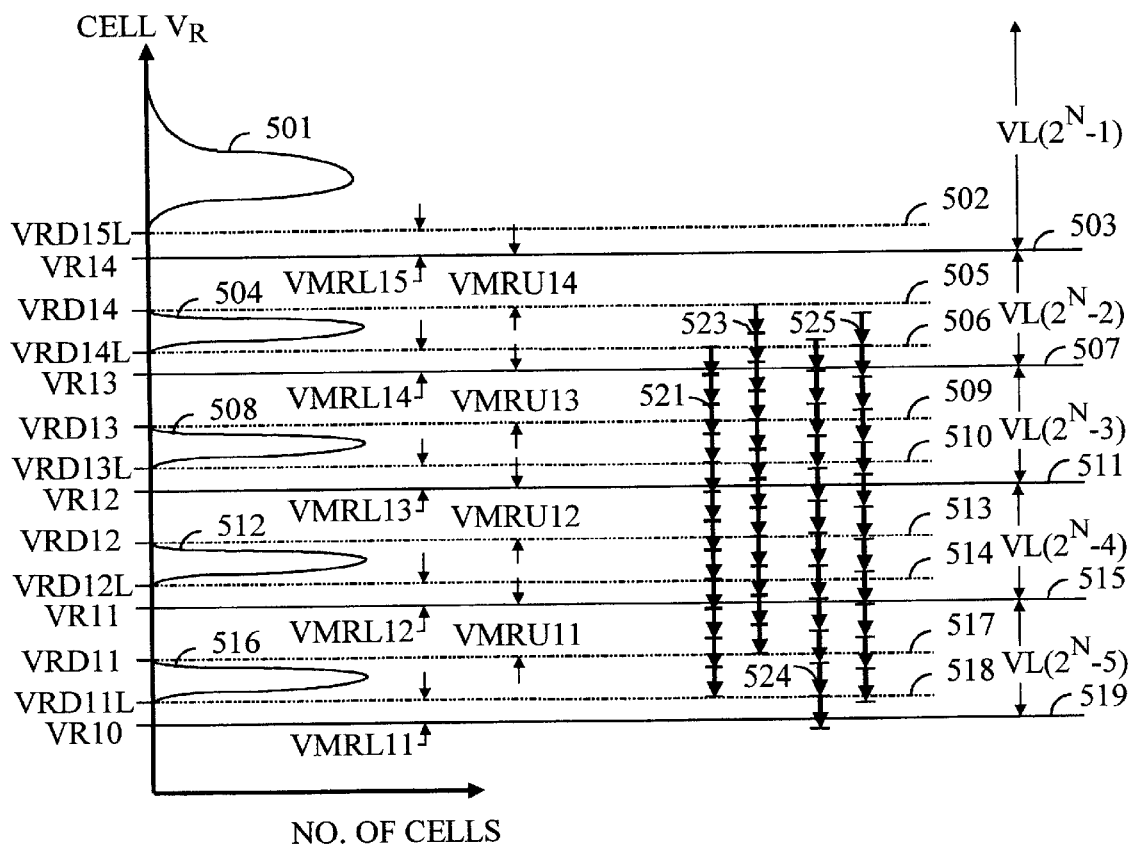
FIG. 3 shows five cell $V_R$ distributions and examples of $V_R$ shift used to describe another embodiment of the present invention utilizing a higher number of programming pulses to reduce programming overshoot and aliasing detection error.

The example in FIG. 3 is similar to FIG. 1 but shows two more levels, VL($2^N$−4) and VL($2^N$−5). A third programmed cell $V_R$ distribution 512 consists of cells verified with $V_R$ between a reference voltage VRD12, represented by a dotted and dashed line 513 and a reference voltage VRD12L, represented by a dotted and dashed line 514. During normal read operation, cells with $V_R$ between reference voltage VR12 and a reference voltage VR11, represented by a solid line 515, will be read as being within level VL($2^N$−4). However, during verification soon after programming, an adequate upper margin VMRU12 defined by the difference between reference voltages VR12 and VRD12 and an adequate lower margin VMRL12 defined by the difference between reference voltages VR11 and VRD12L are provided to help maintain data integrity in case $V_R$ drifts subsequent to the programming operation.

A fourth programmed cell $V_R$ distribution 516 consists of cells verified with $V_R$ between a reference voltage VRD11, represented by a dotted and dashed line 517 and a reference voltage VRD11L, represented by a dotted and dashed line 518. During normal read operation, cells with $V_R$ between reference voltage VR11 and a reference voltage VR10, represented by a solid line 519, will be read as being within level VL($2^N$−5). However, during verification soon after programming, an adequate upper margin VMRU11 defined by the difference between reference voltages VR11 and VRD11 and an adequate lower margin VMRL11 defined by the difference between reference voltages VR10 and VRD11L are provided to help maintain data integrity in case $V_R$ drifts subsequent to the programming operation.

In FIG. 3, four cell examples 521, 523, 524, and 525 are shown to demonstrate the method for detecting cells with overshoot and program aliasing problems by increasing P to twelve and programming through three levels during phase three of the test. In the first cell example 521, thirteen short horizontal bars separated by twelve arrows represent a sequence of twelve $V_R$ shifts during twelve sequential programming pulses. Cell 521 starts with an initial $V_R$ at the VRD14L end of cell $V_R$ distribution 504 and shifts just within and at the VRD11L end of the distribution 516 after twelve programming pulses. If this cell programmed with more than the desired 25 mV resolution, it would be detected as overshooting the desired cell $V_R$ distribution 516 ($V_R$<VRD11L) and fail the test.

The cell examples 521, 523, 524, and 525 are respectively analogous to cell examples 500, 526, 527, and 528 described previously in FIG. 1. Cell examples 521, 523, 524, and 525 have the same respective starting $V_R$ within cell $V_R$ distribution 504 and the same respective del$V_R$ as cells 500, 526, 527, and 528 in FIG. 1. In other words, the cell examples shown in FIG. 3 behave identically to those in FIG. 1. The results after the twelve phase three programming pulses are identical for the example cells in FIG. 3 as in FIG. 1 except for cell example 525. In FIG. 3, cell example 525 which could not be properly detected using the technique described in FIG. 1 is now properly detected in FIG. 3 as a cell with programming overshoot and aliasing. This is accomplished by increasing P and Z as described above.

Other fine-tuning of the above-described testing methods could be done. For instance, the programming conditions could be adjusted to provide testing guard bands to account for worst case programming at specified operating temperature or power supply voltage conditions during less expensive room temperature testing.

Although the choice of using the programming levels closest to the erased level is not intended to limit the invention, the first programming level next to the erased level will take the shortest time to program and will save test time especially when using the high programming resolution needed to produce the tight range of cell $V_R$ distribution 534 in FIG. 2. Additionally, in the case of some FLASH memory cell types, the programming rate decreases due to the change in the vertical electric field as the cell programs and more electrons are added to the floating gate. Thus, programming resolution is more sensitive to the voltages and currents applied to the cell when the cell is initially at or near the erased level than in more programmed levels. Thus, programming overshoot is more likely to occur at the levels closest to the erased level and it is preferred to test those levels. If unequal or asymmetric levels are used, the methodology can be applied to the combination of levels that are most sensitive to programming overshoot near the erased level.

Figure 4:
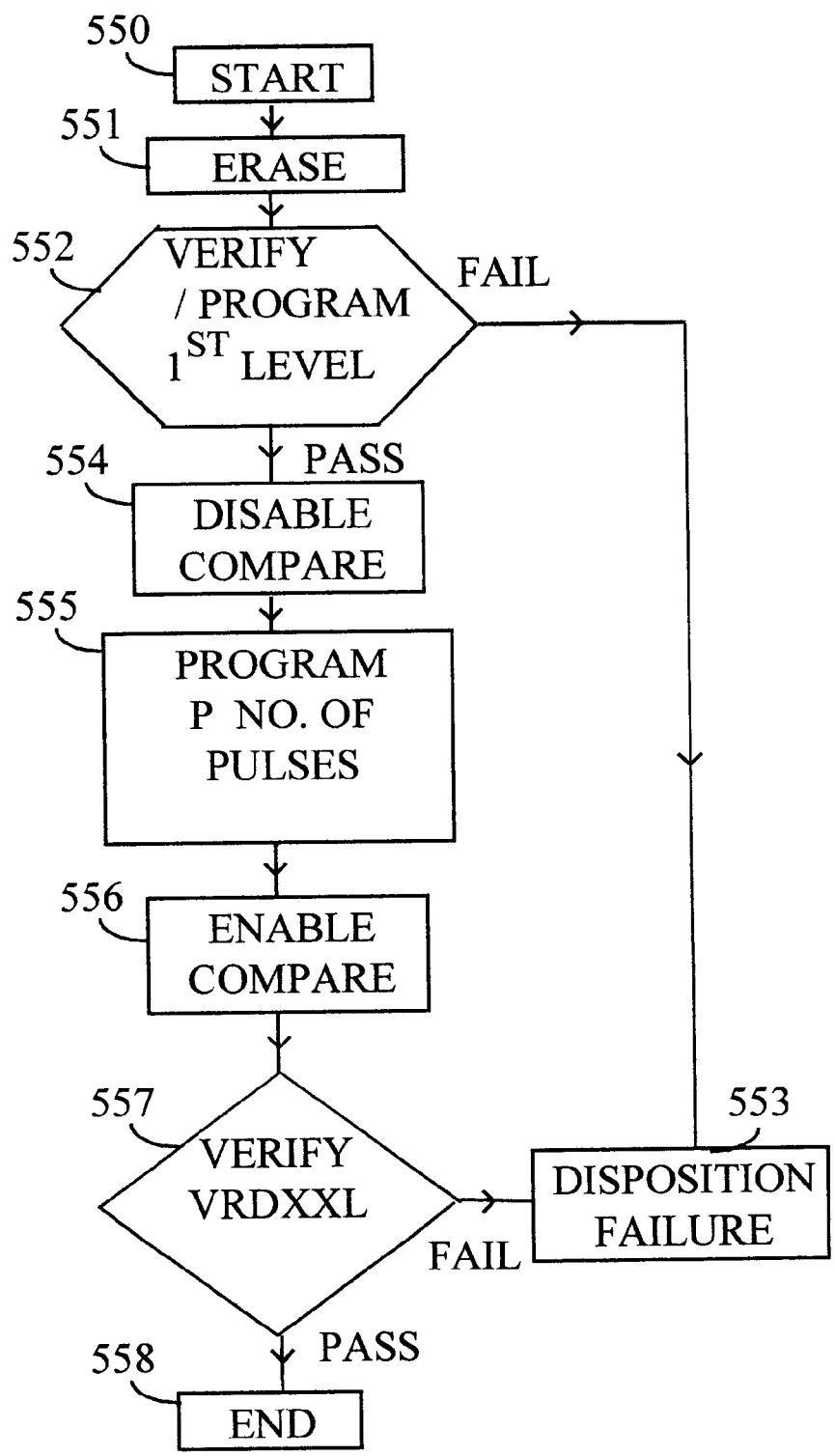
FIG. 4 is a flow chart for detecting multilevel programming overshoot and aliasing in accordance with one embodiment of the present invention.

FIG. 4 shows a flowchart for a test methodology in accordance with a preferred embodiment of this invention. The special test mode to detect programming overshoot and aliasing is initiated by the sequence of test steps under the control of a memory tester system working cooperatively with the memory chip's control circuitry and the improvements discussed herein. After a START step 550, which enters the test sequence, an ERASE step 551 erases the cells to be tested, resulting in the erased cell $V_R$ distribution 501 (FIGS. 1–3). Step 551 corresponds to the first phase of the three phase test described earlier.

Next, a VERIFY/PROGRAM 1st LEVEL step 552 programs a page of cells defined later to be tested to a first programmed cell $V_R$ distribution within a level deemed most sensitive to overshoot effects (e.g., VL($2^N$−2) in the examples previously discussed). This first programmed level may result in a standard width $V_R$ distribution as described by example cell $V_R$ distribution 504 (FIGS. 1, 3); or the first programmed level may result in a smaller cell $V_R$ distribution 534 (FIG. 2) than that which results after a standard programming operation by using special test modes to modify the programming parameters. The memory chip enters these special test modes when the tester system issues predetermined commands and passes certain signals to the chip, which the memory chip's control circuitry recognizes and responds accordingly.

Step 552 corresponds to the second phase of the three-phase test described earlier. The choice of programming level used may be determined by standard chip operations (for example, loading the appropriate data bits from the external tester into on-chip data latches), or by special test mode (for instance, directly setting the bits in the on-chip data latches via internal circuits). The programming technique used may be determined by standard chip operations (for instance, standard programming mode), or by special test mode (for instance, modifying the programming parameters under direct tester control or selecting predefined special parameters stored on-chip) appropriate to obtain the desired cell $V_R$ distribution. It should be noted that certain details here and in other parts of this flow chart such as selecting a particular row and page, incrementing the page and setting maximum number of programming pulses which are obvious to one skilled in the art have been omitted and should not limit the invention.

If any cells fail to verify correctly, a DISPOSITION FAILURE step 553 dispositions the failure. The disposition of the failure may include any combination of the following steps: replace the failing cell with a healthy cell by invoking redundancy; identify the section of the core that includes the failure(s) as defective; reconfigure the number of bits per cell (i.e., reduce N); or fail the part. The external tester can control the failure disposition with or without the help of on-chip self test circuitry. The DISPOSITION FAILURE step 553 may also store bad address or sector information on or off-chip for future use by a SYSTEM MICROCONTROLLER 802 shown in FIG. 10 to be coupled to a NONVOLATILE MULTILEVEL MEMORY I.C. SYSTEM 806 via a CONTROL BUS 804. The SYSTEM MICROCONTROLLER 802 can then map out each of the bad addresses or sectors from the system memory space, thus avoiding those defective regions of the NONVOLATILE MULTILEVEL MEMORY I.C. SYSTEM 806.

An on-chip comparator is used to perform the verify operation in the iterative verify-program algorithm. During verify, the on-chip comparator compares the $V_R$ value corresponding to the data retrieved from the array with predefined reference voltage signals corresponding to the desired data stored in on-chip latches. The outcome of the comparison controls other on-chip latches that control programming switches. In the FIG. 4 flow chart, if the page of cells passed step 552, the memory chip's control circuitry disables the on-chip latches that control the programming switches at a DISABLE COMPARE step 554. This step begins the sequence of steps corresponding to the third phase of the three-phase test described earlier. The on-chip latches remain disabled until they are enabled. Disabling the on-chip latches will allow a predetermined number of programming pulses, P, to couple into the cell irrespective of a verify condition generated by the on-chip comparator.

Next, the P programming pulses are applied to the page of cells being tested at a PROGRAM P NO. OF PULSES step 555. The programming technique used may be determined by standard chip operations (for instance, standard programming mode), or by special test mode (for instance, modifying the programming parameters under direct tester control or selecting predefined special parameters stored on-chip) appropriate to obtain the desired del$V_R$ shift per programming pulse. Each programming pulse is passed to all cells in the selected page simultaneously. The P programming pulses are passed to the cells since the on-chip latches are still disabled.

Next, an ENABLE COMPARE step 556 enables the on-chip latches to re-establish sensing operation. The page previously programmed with P programming pulses is now verified using a special verify mode to compare the cell $V_R$ to a predetermined reference voltage during a VERIFY VRDxxL step 557. The choice of which VRDxxL to use for verification depends on Z, P, the width of the first programmed cell $V_R$ distribution, and the acceptable del$V_R$ error, which are determined as explained earlier. In one of the examples previously discussed, the verify operation passes the cell if $V_R$>VRD($2^N$−(2+Z))L and fails the cell if $V_R$<VRD($2^N$−(2+Z))L. The cells failing step 557 are those with the program overshoot and aliasing problem. If any cells fail to verify correctly, the DISPOSITION FAILURE step 553 again dispositions the failure as described above. If the cells pass the special verify, an END step 558 indicates the test sequence is completed and returns the chip to normal operation mode. Steps 554 through 557 correspond to the third phase of the three-phase test described earlier.

The sequence of steps 551 through 557 may be repeated for multiple pages and rows until the cells have all been tested. Steps 550 through 558 may be invoked by preprogrammed sequencing controlled by on-chip logic state machine or by special test modes controlled by the external tester or any combination thereof.

Figure 5:
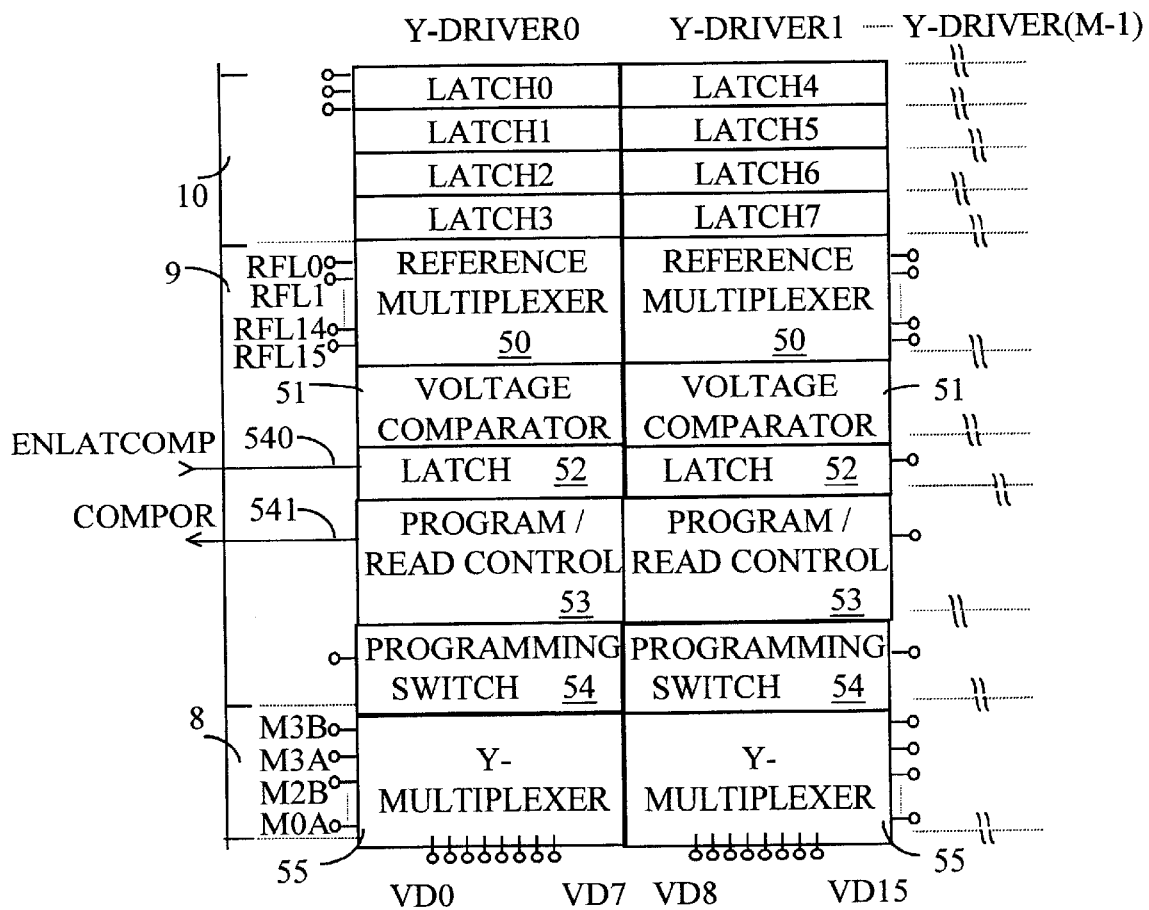
FIG. 5 is a block diagram of a y-driver circuit that detects multilevel programming overshoot and aliasing in accordance with one embodiment of the present invention.

FIG. 5 shows multilevel array column driver circuit blocks Y-DRIVER0-Y-DRIVER (M−1) in accordance with an embodiment of the present invention. The Y-DRIVER circuit blocks drive array columns in 4-bit per cell multilevel storage operation. Details of two of the M Y-DRIVER blocks are shown. Each of the M Y-DRIVER blocks includes a block of four data latches 10, a read-write block 9, and a column multiplexer block 8. Inside each read-write block 9, a REFERENCE MULTIPLEXER 50 couples one of 16 reference voltage signals RFL0 through RFL15 to a voltage comparator 51. The VOLTAGE COMPARATOR 51 is coupled to a LATCH 52 which is in turn coupled to a PROGRAM/READ CONTROL block 53. The PROGRAM/READ CONTROL block 53 couples to a PROGRAMMING SWITCH block 54 which is in turn coupled to a Y-MULTIPLEXER block 55. In this embodiment, each Y-MULTIPLEXER block 55 is coupled to 8 array columns, e.g., VD0–VD7.

Each Y-MULTIPLEXER 55 only selects one of the 8 columns at a time to be coupled to the read-write block 9. Thus, the M Y-DRIVER blocks operate to simultaneously select M columns at a time. An x-decoder block (not shown) selects one row of the memory array. The intersection of the selected row and selected M columns thus selects what is called a page of M memory cells at a time. The PROGRAM/READ CONTROL block 53 controls the sensing and programming operations. Each Y-DRIVER block can operate on its selected column independent of the other Y-DRIVER blocks. Data storage is performed on a page basis, and by choosing an M value much greater than 8 or 16 the chip performance is improved.

For instance, during page sensing, each Y-DRIVER can independently perform the sensing operation. Each Y-DRIVER performs the sensing operation by comparing a value on a predetermined RFL signal selected by REFERENCE MULTIPLEXER 50 against a value generated on the column selected by Y-MULTIPLEXER 55. The value on this selected column during sensing operations is called the $V_R$ value and corresponds to the multilevel data stored in the cell located at the intersection of the selected column and selected row. The outcome of the comparison performed by VOLTAGE COMPARATOR 51 controls Latch 52. During read sensing, data from the selected cells is read into data latches 10 in a predetermined sequence by PROGRAM/

READ CONTROL block 53 and which may be based on the state of Latch 52 after each read comparison sequence. Multilevel data can thus be read out of a page of M cells simultaneously.

During page programming, the Y-DRIVER blocks again operate independently of one another. One Y-DRIVER can be programming while another can be inhibiting programming for their respectively coupled columns. If N is the number of digital bits stored per multilevel cell, then during programming operation, the N×M bit data page to be stored in the nonvolatile memory is first serially loaded into data latches 10 in the M Y-DRIVER blocks. Then, based on the data stored in data latches 10 of each Y-DRIVER, the corresponding REFERENCE MULTIPLEXER 50 selects a predetermined RFL signal to represent the data for that Y-DRIVER.

In one embodiment, the memory chip executes an iterative programming algorithm of repeated verify-program operations on the M Y-DRIVER blocks simultaneously. The verify operation is performed in a similar fashion as read sensing described above with the exception that the RFL signal is already selected by REFERENCE MULTIPLEXER 50 based on the state of data latches 10. If the outcome of the comparison between the value on the selected RFL signal line and $V_R$ value indicates the cell is insufficiently programmed, PROGRAMMING SWITCH block 54 couples the next programming pulse to the selected cell. A programming pulse is defined as setting all the necessary programming conditions on all terminals of the cell to accomplish the desired programming effect. Those necessary programming conditions may include such programming parameters as high voltage duration and ramp rates, cell current, and gate, drain, or source voltage values leading up to, during, and after the actual high voltage pulse responsible for programming the cell and their timing relationships. However, if the comparison between the RFL and $V_R$ values indicates the cell has already been sufficiently programmed, PROGRAMMING SWITCH block 54 does not couple the next programming pulse to the selected cell and programming is inhibited. The verify-program operations are repeated until either the M Y-DRIVERS have passed programming by verifying successfully or a predetermined maximum number of verify-program operations have been performed. In this fashion, the entire page of data is programmed simultaneously.

In another embodiment, an ENLATCOMP signal 540, which is an input signal to LATCH circuit block 52, controls the verify sensing operation. ENLATCOMP signal 540 is controlled by the memory chip's global control circuitry located outside the Y-DRIVER blocks and not shown in the figures. When the chip is operated in the normal iterative verify-program algorithm mode, ENLATCOMP signal 540 enables LATCH circuit block 52. Thus, the outcome of the sensing function performed by VOLTAGE COMPARATOR 51 is allowed to control PROGRAMMING SWITCH block 54 via PROGRAM/READ CONTROL block 53. If the cell does not verify to the desired reference voltage value, the state of the LATCH 52 output allows the next programming pulse to pass through the PROGRAMMING SWITCH block 54 to the selected column via Y-MULTIPLEXER block 55. The ENLATCOMP signal 540 is coupled to and controls the Y-DRIVERS in parallel.

In yet another embodiment, a COMPOR bus 541, which is an output of PROGRAM READ CONTROL block 53, indicates the outcome of the verify sensing operation. When the chip is operated in the normal iterative verify-program algorithm mode, COMPOR bus 541 indicates the outcome of the sensing function performed by VOLTAGE COMPARATOR 51 to the memory chip's global control circuitry. The COMPOR bus 541 is coupled to the Y-DRIVERS in parallel. One of the signals in COMPOR bus 541 may function in a wired-OR fashion. This signal gives an indication to the memory chip's control circuitry when the M cells have verified successfully to the predetermined reference voltage values (for example, when the VRDxxL<$V_R$<VRDxx). Another one of the signals in COMPOR bus 541 may give an indication to the memory chip's control circuitry when any of the M cells have failed to verify successfully to a predetermined reference voltage value (for example, when $V_R$<VRD($2^N$-(2+Z))L).

The COMPOR bus 541 provides a new degree of self-testing which speeds up the chip in normal and test mode operation. Without COMPOR bus 541, it would be necessary to read out the data in a page after programming in order to allow the tester to determine if the data stored on-chip matches the desired data pattern stored in the tester's memory. This full page read out is a lengthy process depending on how many bits are stored per cell and how many cells per page. For instance, a 4-bit multilevel page with 1024 cells at a 50 nS read cycle time and 8 parallel outputs would take 4×1024×50 nS/8=25.6 mS which is comparable to the time to program or read the page. The COMPOR bus 541 provides a way to replace the long data read out after programming with a much shorter COMPOR control signal interrogation step. If the tester determines the page programmed correctly via the COMPOR control signal interrogation, the next page can be programmed or tested. Only if a failure occurs does the tester require a full page data read out in order to determine the failing address location. In this way, testing and normal operating speeds can be improved.

The ENLATCOMP signal 540 and COMPOR bus 541 are used to control the third phase of the programming overshoot and aliasing detection test mode described earlier. In phase three of the test mode, ENLATCOMP signal 540 disables LATCH circuit block 52. Thus, the outcome of the sensing function performed by VOLTAGE COMPARATOR 51 is not allowed to control PROGRAMMING SWITCH block 54. Independent of the outcome of the verify comparison, the latch output allows the next programming pulse to pass through PROGRAMMING SWITCH block 54 to the selected column via Y-MULTIPLEXER block 55. This occurs simultaneously for the M Y-DRIVERS (and cells) in parallel. During this special test mode the COMPOR bus 541 may be ignored by the memory chip's control circuitry.

Other features include changes to the memory chip's control circuitry which force the chip to step through it's sequencing under direct control of an external tester system. During the third phase of the special test mode, the external tester system controls the number of programming pulses P. Under control of other test modes which can be simultaneously performed during the third phase, the programming voltages and currents applied to the M cells can be adjusted for any fine tuning of the test as required to efficiently and reliably detect the cells that exhibit overshoot and aliasing. The same test modes mentioned above can be used to modify the programming to produce the first programmed cell $V_R$ distribution 534 (FIG. 2) spanning a smaller voltage range to improve test accuracy.

Multilevel Programming Pattern

In accordance with an embodiment of the present invention, a new multilevel programming data pattern is used to efficiently determine whether the cells in the array receive the proper control signals for reliably programming and sensing multilevel data.

An efficient programming pattern that: 1) programs the chip once, and 2) programs only specific portions of the chip, but 3) tests most of the chip multilevel functionality will be described.

Figure 6:
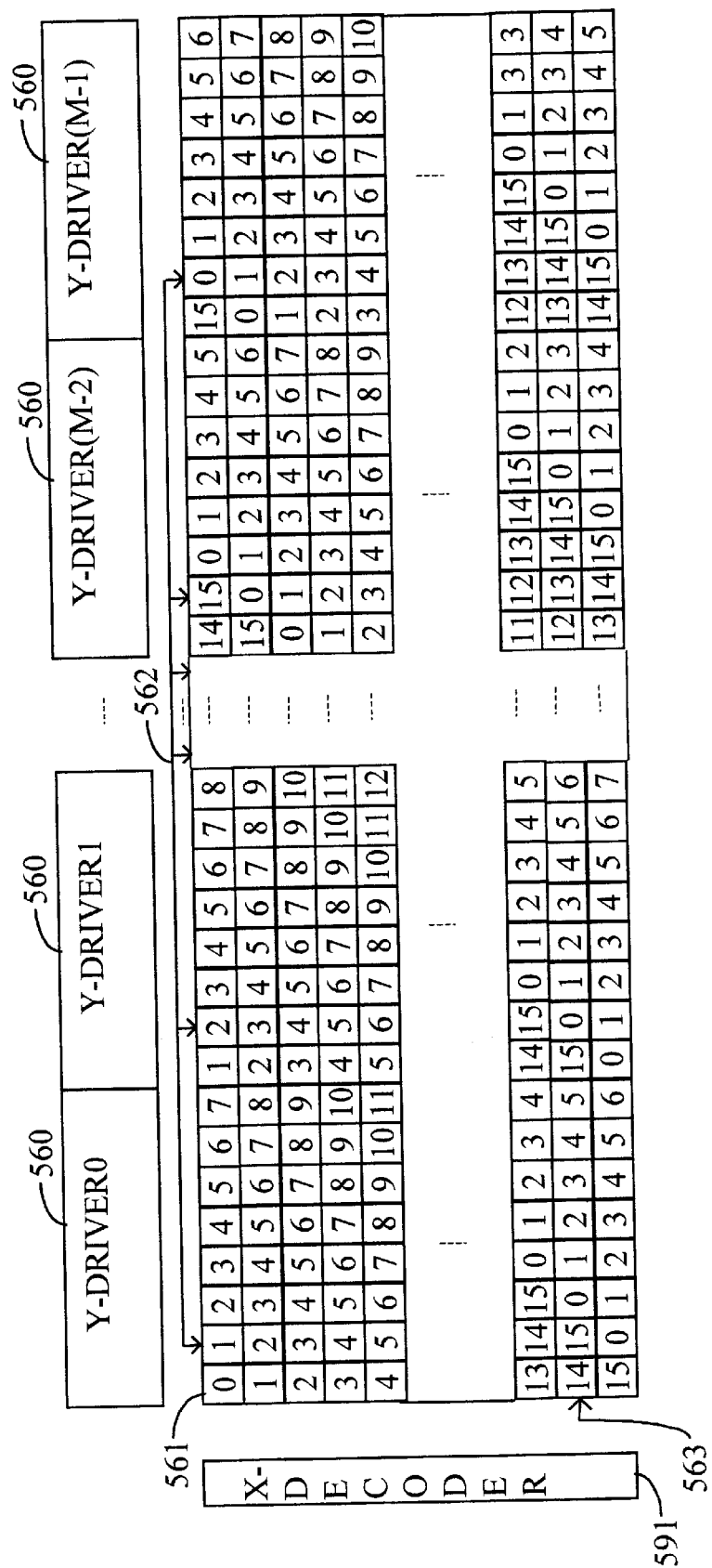
FIG. 6 is an example of a multilevel programming pattern of an embodiment of this invention used to efficiently test signals in a multilevel memory array.

FIG. 6 is used to describe an example of a multilevel programming pattern, shown in FIG. 6 as pattern 561, that accomplishes efficient multilevel functionality testing. FIG. 6 further shows a portion of a memory array, M Y-DRIVER blocks 560, and an X-DECODER block 591. Each of the M Y-DRIVER circuit blocks 560 is capable of selecting and driving 1 out of K columns, where K=the number of columns per Y-DRIVER circuit block 560. In the FIG. 6 example, K=8 columns. The M Y-DRIVER circuit blocks 560 simultaneously select M columns at a time. The intersection of the M columns with one selected row driven by X-DECODER circuit block 591 selects M cells that can be simultaneously programmed or sensed as a group called a page. A line 562 pointing to the second column in each Y-DRIVER circuit block 560 symbolically shows an example of the columns in a selected page of columns. A line 563 pointing to the second row from the bottom of FIG. 6 symbolically shows an example of a selected row. Each row has K pages of cells.

As shown in FIG. 6, each cell of the multilevel memory array programmed in accordance with the multilevel programming pattern 561, is symbolically represented by a small square containing a numeral. The dotted lines between the small squares in the multilevel programming pattern 561 and between the Y-DRIVER circuit blocks 560 indicate elements omitted from the drawing but still allow the drawing to describe this embodiment of the invention to those skilled in the art.

Unlike the conventional checkerboard data pattern of 1's and 0's, the data in each programmed cell corresponds to one of the $2^N$ levels. In this example, with N=4, 16 levels are symbolically represented by the numerals 0 through 15 placed inside each cell.

Memory array architecture and the number of rows and columns of cells programmed in the multilevel programming pattern 561 dictate the choice of which data level to place in which cell. The memory array (a portion of which is shown in FIG. 6) includes both data cells and reference cells (not shown). There are $2^N$ (or 16 in the FIG. 6 example) reference cells associated with each page on each row. Whenever a selected page is programmed, the associated group of $2^N$ reference cells is programmed to the $2^N$ levels. The choice of data placement in the multilevel programming pattern 561 is done in such a way as to test the proper signal values associated with all $2^N$ levels through all possible circuit paths. This is accomplished without having to program each cell in the memory array to all $2^N$ levels.

In one embodiment using the pattern 561, the $2^N$ (=16 in this example) levels are programmed in cells along each column. Thus, the path through each of 1 of 8 multiplexer circuits (now shown) in the Y-DRIVER circuit blocks 560 are tested to ensure that they function properly for all $2^N$ levels. The row paths are similarly checked. Also, within each selected page, all $2^N$ levels are programmed which checks the function of all the group of $2^N$ reference cells associated with the selected page. Thus, all possible multilevel circuit paths are checked.

In another embodiment, pattern 561 is programmed into cell locations on the sides of the memory array substantially furthest away from X-DECODER 591 and Y-DRIVER circuit blocks 560. Such placement helps identify any opens, i.e., discontinuities, in the row and column lines between the driver circuits and the cells as well as shorts between adjacent row lines or adjacent column lines without having to test all the cells in the memory array. N In another embodiment using the multilevel programming pattern 561, $2^N$ rows across all columns and K×$2^N$ columns across all rows are programmed. In the 4-bit per memory cell example shown in FIG. 6, 16 rows are programmed across all columns, and 8×16=128 columns are programmed across all rows. Thus, the smallest repeating subset of the multilevel programming pattern 561 in FIG. 6 consists of K×$2^N$ columns by $2^N$ rows.

In another embodiment using the multilevel programming pattern 561, not only the cells substantially furthest away from the array driver circuits are programmed as described above, but also the group of cells substantially closest to the driver circuits are programmed to more completely test the multilevel circuit signals across the whole array. In greater than 2-bit per cell storage systems, signal resolution and control on the order of few millivolts or less is required, possibly necessitating testing multilevel signal function at both the driver side and the side of the array furthest away from the driver. This is shown in FIG. 7.

Figure 7:
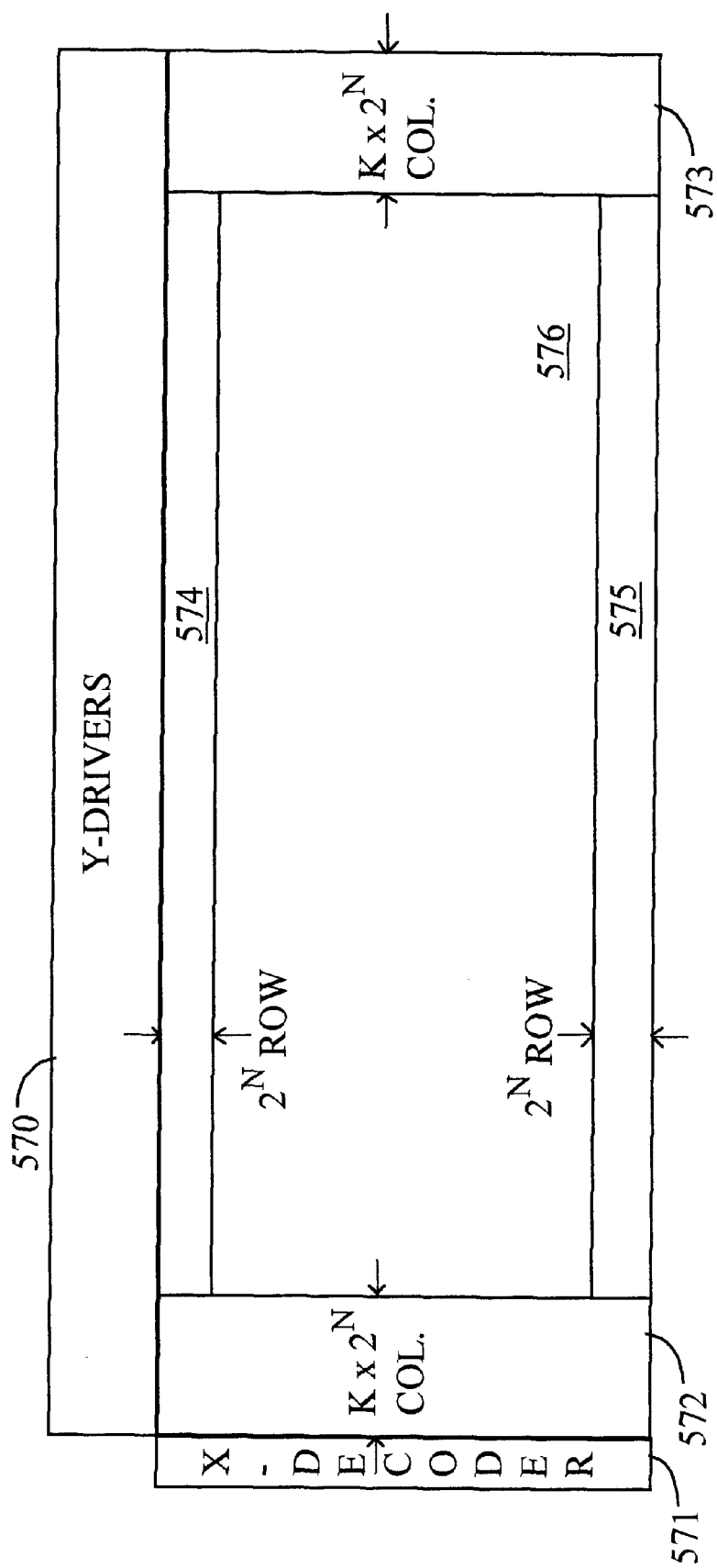
FIG. 7 is an example of a multilevel programming pattern in accordance with an alternative embodiment of this invention.

In FIG. 7, a Y-DRIVERS circuit block 570 and an X-DECODER circuit block 571 driving a memory array are shown. The array consists of 5 sections. The multilevel programming pattern 561 is programmed into four of these 5 array sections. A section of K×$2^N$ columns 572 is programmed next to X-DECODER circuit block 571. A section of K×$2^N$ columns 573 is programmed on the side of the array furthest away from X-DECODER circuit block 571. A section of $2^N$ rows 574 is programmed next to Y-DRIVERS circuit block 570. A section of $2^N$ rows 575 is programmed on the side of the array furthest away from Y-DRIVERS circuit block 570.

Memory array section 576 surrounded by the four sections 572–575 can be left erased to minimize test time and cost while adequate quality for many applications is ensured. Alternatively, array section 576 can be programmed and tested using the multilevel programming pattern 561, or using a reduced value of N as described in the next section, or using all $2^N$ levels for each cell to guarantee the required quality level at the expense of longer test time. Thus, the degree of guaranteed multilevel quality can be a performance parameter with an associated chip cost. In an alternate testing strategy, the extent of testing performed on array section 576 is a function of the prior test results of array sections 572–575. For example, excessive failures in sections 572–575 could dictate more thorough testing of array section 576.

Tight and Gross Multilevel Sensing Margin

The VMRLxx and VMRUxx sensing margins described in FIGS. 1–3 are not fixed amounts but need to be able to be adjusted to different amounts relative to the VRxx values. This is needed to be able to test the sensing margin during either test mode (e.g., during manufacturing process) or during normal mode (e.g., while in customer's system) multilevel operation.

This adjustable sensing margin capability can be used during normal multilevel operation in the following way. After programming, the $V_R$ signal generated by the cell may drift due to disturb conditions imposed on the cell during programming, erasing, or even reading of the cell itself or of other cells sharing the same row or column connections with the selected cell. Imperfections in the cell due to, for example, processing defects, may also cause drift by changing the charge stored in the cell over the course of time. The data will be permanently lost when the $V_R$ drifts too close to the adjacent VRxx value (in other words when VMRLxx or VMRUxx approach a few millivolts). It is a valuable feature to determine when the sensing margin has been reduced due to drift to warn the memory system that it may need to restore the $V_R$ to a larger and more reliable sensing margin before the data is permanently lost. This can be accomplished during normal multilevel read operations by comparing the cell's $V_R$ signal to a reference value that checks for a smaller VMRLxx or VMRUxx amount than the amounts used to verify normal programming. Such a smaller VMRLxx or VMRUxx amount can be called the restore margin. The restore margin amount depends on the width of VLxx, VRxx-VRDxx, VRDxx-VRDxxL, and the sensing resolution. For example, if VLxx=100 mV, VRxx-VRDxx= VMRUxx=35 mV and VRDxx-VRDxxL=30 mV for programming, then VRDxxL-VR(xx-1)=VMRLxx=35 mV and during read operations VMRUxx and VMRLxx can both be set to 15 mV, thus detecting cells that drift more than 20 mV outside the original VRDxx-VRDxxL programming range.

Whenever a page of cells is read, the chip can indicate if any of the cells in the page have a $V_R$ signal which has drifted into the restore margin range via the previously described COMPOR bus 541 which can set a status flag in the chip's control circuitry which can be interrogated after each read operation by the memory system. Since drift occurs over a long time span, the memory system has time to retrieve the valid data before it is lost and reprogram it to restore reliable programming margins at the systems' convenience after detecting the restore warning.

This adjustable sensing margin capability is used during test mode multilevel operation in the following ways called tight margin and gross margin testing. Tight margin testing is used to determine the cell $V_R$ distributions with a greater degree of flexibility and accuracy than during normal programming or reading operations. During testing, the cells may be subjected to stress conditions to accelerate drift in any unreliable cells. Such unreliable cells could then be detected and dispositioned to repair or reject the chip. Since test time is limited to keep costs low, the amount of $V_R$ drift may be smaller than that which normal program verify, read, or read restore sensing can detect. To detect such cells, the cell $V_R$ distribution needs to be accurately determined both before and after stressing using the adjustable tight margin sensing capability as described below.

For example, as previously described in FIG. 2, the programmed cell $V_R$ distribution 534 spanning a smaller $V_R$ range than a normally programmed distribution can be verified by using a wider VMRLxx than normal programming mode to ensure the cells are within the desired tighter programming range. This wider VMRLxx is verified by setting the reference voltage during programming overshoot checking to the value indicated by line 531 in that figure which lies between the VRDxx and VRDxxL values used for a normal verify operation. Now that the initial tight-programmed cell $V_R$ distribution 534 is established, a subsequent sensing operation after stress application can detect any cells drifting out of the tight programmed distribution, e.g., distribution 534 in FIG. 2. Such cells can be detected by reading the page of cells using the restore margin amounts described earlier or other predetermined adjustable tight margin sensing amounts depending on the degree of test accuracy desired.

Even healthy, reliable, good cells may drift under the applied stress test conditions. Continuing the previous example and referring again to FIG. 2 and assuming VRDxxL is the desired adjustable reference level, a good cell may drift down after stress into the range between $V_R$ value 531 and VRDxxL. If the good cell $V_R$ distribution after stress is kept above the predetermined adjustable tight sensing margin range (e.g., above the VRD14L-VR13 range), the bad cells that drift into that range can be detected and dispositioned. A tolerated cell drift amount for passing good cells is thus defined by the approximate difference between the cell $V_R$ distribution before stress and the post stress test margins (for example, the amount defined by $V_R$ value 531-VRDxxL). The tolerated drift amount for acceptable cells can be correlated to cell reliability requirements. For example, if the cells in a chip pass by drifting less than the tolerated drift amount, then the chip is assured of an established reliability goal of withstanding a certain number of programming operations before erasing again.

Using the previous example with VRDxx-VRDxxL=30 mV after programming and VMRLxx=15 mV for reading after stress, the tolerated cell drift is 20 mV. By increasing VMRLxx from 15 mV to 25 mV, for example, would reduce the time the stress conditions are applied and thus reduce test costs compared to using a fixed VMRLxx=25 mV value. Another disadvantage of using a limited set of fixed margins instead of flexible tight margins is reduced test accuracy. This can be understood by considering the previous examples that if, the cells programmed to the standard cell $V_R$ distribution 504 (FIG. 1) instead of the tight programmed cell $V_R$ distribution 534 (FIG. 2), there would be an error in determining the reliability drift limit in the amount of the difference between the widths of the two different programming distributions. That is because cells drifting from an initially programmed $V_R$ value at the top of the $V_R$ distribution are indistinguishable from cells drifting initially from the bottom of the programmed $V_R$ distribution, thus, the wider the initial programmed $V_R$ distribution the greater the error. That increased error would result in either passing less reliable cells or rejecting more good cells and again increasing chip cost.

The reference values VRxx are obtained either directly from a reference voltage generator circuit or from the cell $V_R$ values of a set of reference cells pre-programmed to the $2^N$ levels. The characteristics of the reference cells track the core cells and reduce errors introduced by electrical noise and changing power supply and temperature variations. It is similarly desirable to ensure that the tight margin sensing values (e.g., $V_R$ value 531 in FIG. 2 and the restore margins described above) track with the VRxx values to maintain this error rejection. One way to achieve this margin tracking is to use a predefined tight margin sensing value, which is summed with the VRxx reference values to produce the desired reference values to be used during tight margin sensing.

The predefined tight margin sensing value can be controlled as a continuous variable based on an analog tester input to the chip. However, that technique is difficult to implement. In the examples used in this specification, the predefined tight margin sensing value may need to be a small amount in the range of 5 mV to 100 mV. Tester noise can easily be much more than 100 mV, so complex on-chip level translation circuits would be required to translate larger tester signal levels applied to the inputs of the chip down to the desired smaller values. Such translation circuits are prone to introducing their own errors on top of the tester noise and thus make the desired test accuracy hard to achieve.

A more preferred method of providing the predefined tight margin sensing value is to generate a set of predefined tight margin sensing values internally in the chip, and to select which one to use via digital input received from a tester. This avoids the need for translation circuits. Tester noise problems are also reduced since the selection process uses standard digital signal techniques with high noise immunity.

Various useful testing methods can be employed by providing the flexibility to adjust the VMRLxx or VMRUxx amounts in small increments. The examples given above have used figures showing programmed levels near the erased level, however, the level being tested may be any one of the $2^N$ levels depending on the particular test required and the sensitivity of the cell to that test. For example, programmed cells tested for drift in the erased state direction, i.e., erase drift, may be more sensitive to that drift when starting from the most programmed level.

This invention is not limited to the testing of only programmed levels. The erased level in FIGS. 1–3 have a VMRL15 margin value which according to this invention can be adjusted such that the degree to which cells are erased can be sensed. The value of VRD15L can be adjusted during testing and set to a desired value to optimize manufacturing yield, to perform stress tests on the erased cell $V_R$ distribution 501, or can be changed by a system in the field to counteract possible deleterious effects of repeated program/erase cycles. Cells sensed with a $V_R$ value below VRD15L indicate insufficient erase margin thus identifying an erase sector requiring disposition by the tester or system in the field. The bad erase sector can be replaced with redundant sectors or the bad sector address can be saved on chip or by the system controller in the field to later avoid that bad sector. The techniques discussed in this specification are equally applicable to testing for problems in any of the $2^N$ levels used for multilevel operation including both erased and programmed levels.

Gross margin testing is used to determine the cell $V_R$ distributions with a lesser degree of accuracy than during normal programming or reading operations. This is used to greatly speed up testing. Gross margin testing can be thought of as a way to force a multilevel sensing system to behave as if the cells store less than the full N bits per cell. This is used to greatly speed up testing especially for multilevel systems with N>2. In such systems the read sensing may be divided into N or more sensing cycles (N+1 sensing cycles with restore sensing) which can take N times as long to read the cells compared to single bit per cell storage. Page mode operation (e.g., M on the order of 1024) helps to offset this multilevel performance disadvantage. During testing, the chip is read or verified numerous times and any reduction in the duration of each individual sensing operation helps reduce test costs. Gross margin sensing can be used during some tests of a multilevel chip to reduce the test time by reducing either the number of sensing cycles and/or the duration of programming or erasing tests as will be explained below.

One way gross margin sensing speeds up testing is in conjunction with another test mode called mass mode programming or erasing. Mass mode means a larger number of cells are operated upon simultaneously than normal mode operation. For instance, a mass mode programming operation could override the normal iterative programming algorithm and program a plurality of pages at the same time. To further speed up this testing, the mass mode may not perform as accurate an operation as the normal mode version of the same operation. For example, a mass mode programming may use much larger programming $delV_R$ than the standard programming mode to program the cell as quickly as possible without regard to multilevel requirements. Alternatively, mass mode programming may be used to quickly shift the cell $V_R$ through all $2^N$ levels to determine if the cell is capable of storing the full range of levels (e.g., from the erased state to the most programmed state). These two applications of mass mode programming may require different gross margin sensing strategies. Alternatively, mass mode programming can be used to program data patterns such as a checkerboard-like pattern (e.g., use only 2 of the $2^N$ levels) described earlier. Mass mode tests would be used near the beginning of the test flow to repair or weed out bad chips using speedier test routines and saving the longer multilevel test routines for chips already demonstrating a good deal of functionality after mass mode testing. The total test time can thus be reduced.

Figure 9:
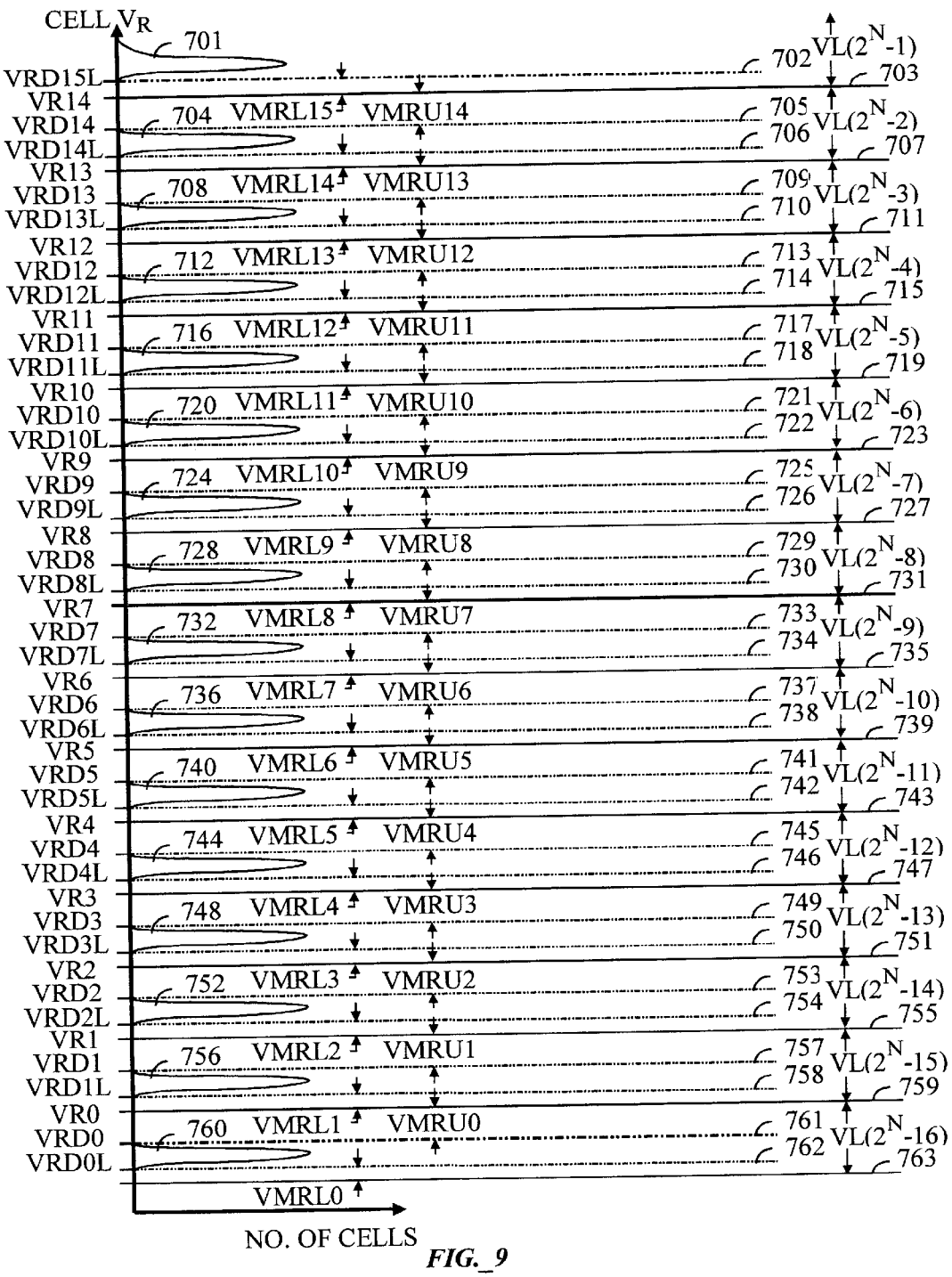
FIG. 9 shows an example of an entire range of $2^N$ levels of cell $V_R$ distributions and reference values for gross margin sensing in accordance with an embodiment of the present invention.

In an example of the first application of mass mode programming to speed up testing, the entire VL range of $2^N$ levels can be broken into roughly symmetric upper and lower halves divided by a predetermined center reference value 731 as shown in FIG. 9. This center reference value 731 could, for instance, be chosen to correspond to VR7 for a $2^N=16$ system. The gross margin sensing technique would then use this predetermined center reference value 731 as the only reference comparison. Cells with $V_R$ lower than the predetermined center reference value 731 would be sensed as passing the gross programming test, and cells with $V_R$ higher than the predetermined center reference value 731 would be sensed as erased. Only a single sensing cycle is required to accomplish this comparison, which speeds up sensing as much as possible. The gross margin in this application is essentially zero since, by definition, a margin requires a plurality of reference values.

In an example of the second application of mass mode programming to determine if the cell is capable of storing the required range of levels, at least two gross margin reference levels are required for sensing, a predetermined reference value 702 corresponding to VRD15L and a predetermined reference value 761 corresponding to VRD0 in the examples shown in FIG. 9. These two predetermined reference values 702 and 761 divide the entire VL range of $2^N$ levels into three regions; fully erased, fully programmed, and failing in between. For example, any cell with $V_R$ higher than reference value 702, VRD15L, would be sensed as fully erased and any cell with $V_R$ lower than reference value 761, VRD0, would be sensed as fully programmed. Any cells with $V_R$ between reference values 702 and 761, VRD15L and VRD0 respectively, would be considered as failures. Here, the in between range constitutes a single gross margin which is as large as possible. Alternative testing methods could require the two gross margin reference values be chosen closer towards the center of the full VL range (e.g., closer to VR7) with a smaller single gross margin. This may be required in the case of using shorter mass programming or erasing test times. Sensing two predetermined gross margin reference values would take two sensing cycles but still reduces test time significantly compared to sensing N bits.

In yet another alternative, the N or more standard sensing cycles can still be used to simplify the circuit design. In this case, a combination of the predetermined center reference value 731 together with the two predetermined gross margin reference values 702 and 761 are used during sensing. Any cell programmed or erased to any degree would easily pass sensing using the predetermined center reference value 731. Thereby setting all $2^N$ VRxx reference values to that predetermined center reference value 731 except for the two predetermined gross margin reference levels 702 and 761 allows the standard N (or N+1) cycle sensing algorithm to still be used. For example, a standard five cycle sensing algorithm can be used wherein three of the five sensing cycles may be a repeat and thus waste some time. However, silicon area is saved by eliminating additional state machine circuitry which would otherwise be needed to implement an independent three cycle sensing algorithm.

Another useful application of the tight and gross margin methods described above is the ability to utilize a subset of the $2^N$ levels to reliably store less than the full N bits per cell in all or part of the multilevel memory. The previous gross margin examples described how the N bits per cell multilevel storage system could be reconfigured to store a single-bit per cell. The memory system can be reconfigured as required to store one, two, three, or up to the full N bits of information per cell. The advantage of storing less than the full N bits per cell is described in the following examples.

The first application example is to enable the N-bit multilevel chip to be reconfigured to work with less than N bits per cell during testing in order to improve manufacturing yields. In this case the degree of multilevel storage provided to the customer is considered a performance criteria similar to chip speed. Just as a slower version (or test binning) of a chip can be marketed at a reduced cost compared to the fastest bin, a multilevel chip can be binned by the degree of reliable multilevel storage. For example, an N-bit per cell 1 gigabit chip which fails testing for N-bit storage could be reconfigured to be a useful 512 megabit chip after passing the test with just N/2 bits per cell storage or a 256 megabit chip after passing the test with just N/4 bits per cell storage.

The multilevel storage system described above could also be reconfigured such that a portion of the memory operates with a different number of bits per cell than another portion of the array. Reducing N may also, in some design embodiments, improve memory system write and/or read speeds. How challenging multilevel storage is from both design and device engineering perspectives, particularly when N is greater than 2, has been well-documented. Those challenges, if not properly addressed, result in production yield problems and thus higher costs. This invention helps overcome many of those yield problems.

The second application example is to enable the N-bit multilevel chip to be reconfigured to operate with less than N bits per cell as determined by chip logic or by the SYSTEM MICROCONTROLLER 802 (FIG. 10) in order to improve reliability in the field or to prevent system failure. Restore sensing, which was described previously, can enable the memory system determine when a cell's $V_R$ has drifted to the point that the sensing margin is approaching an unreliable condition. In lieu of the system performing a restore operation to repair the data, it may be determined that the memory (or a section thereof) needs to have N reduced to prevent system failure or optimize system performance. This may be the case when too many restore operations have been required to perform or when restore operations are too inconvenient to perform. Alternatively, even without utilizing the restore feature, the system may determine that reducing N may recover reliable operation. Imagine a storage device that informs the user it has worn out somewhat but is still capable of operating with less storage capacity. The result of reducing N in a field application could reduce the storage capability of a system but be much more desirable than a complete system failure.

Figure 8:
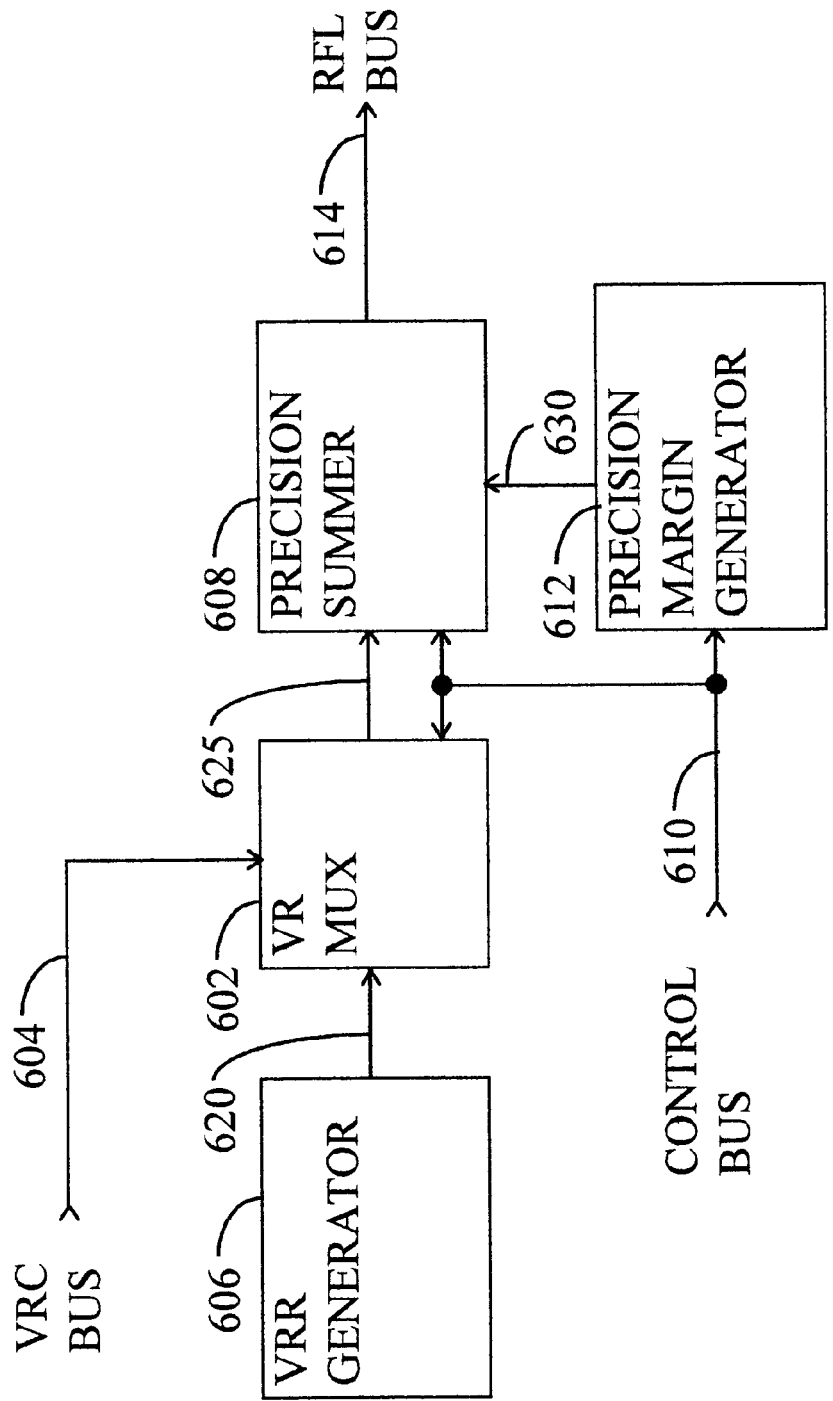
FIG. 8 is a circuit block diagram which generates a set of predefined tight or gross margin sensing values in accordance with an embodiment of the present invention.

FIG. 8 shows a block diagram of reference voltage generator circuit internally implemented in the memory chip in accordance with a preferred embodiment of the present invention. The circuit of FIG. 8 generates either a set of predefined tight margin reference voltage signals or one or more gross margin reference voltage signals on a RFL BUS 614. A VR MUX circuit block 602 receives VRC signals via a VRC BUS 604, VRR signals from VRR GENERATOR circuit block 606 via a bus 620, a set of control signals via a CONTROL BUS 610, and provides a set of signals to a PRECISION SUMMER circuit block 608 via a bus 625. In addition to the signals on bus 625, PRECISION SUMMER block receives a signal from a PRECISION MARGIN GENERATOR circuit block 612 via a signal line 630, as well as control signals via CONTROL BUS 610, and provides a predefined number of reference voltage signals on RFL BUS 614. PRECISION MARGIN GENERATOR block 612 provides a signal on signal line 630 and receive control signals via a CONTROL BUS 610. RFL bus 614 couples to the REFERENCE MULTIPLEXER circuit block 50 in the Y-DRIVERS shown in FIG. 5.

The circuit of FIG. 8 operates in the following fashion. The VRC BUS 604 transmits the $V_R$ signals from the array reference cells while the VRR GENERATOR circuit block 606 generates reference signals based on reference circuits other than cells. The VR MUX circuit block 602 couples reference signals either from VRC BUS 604 or from VRR GENERATOR circuit block 606 depending on the state of the CONTROL BUS 610. Reference cells are programmed using reference signals generated by the VRR GENERATOR circuit block 606 while data cells can be programmed or sensed using either the VRR GENERATOR circuit block 606 or the VRC BUS 604. The PRECISION MARGIN GENERATOR circuit block 612 generates the set of predefined tight margin sensing values and couples one of those values to the PRECISION SUMMER circuit block 608 based on the state of the CONTROL BUS 610.

During tight margin test mode the CONTROL BUS 610 can instruct the PRECISION SUMMER circuit block 608 to add (or subtract) one of the predefined margin values to (from) each of the signals coupled from the VR MUX circuit block 602 and output the result on the RFL BUS 614. The signals on the RFL BUS 614 are then used to ensure the tight sensing margins.

During gross margin test mode, the CONTROL BUS 610 can instruct VR MUX 602 to force all reference voltage signals received from either VRR GENERATOR 606 or VRC BUS 604 to a predetermined center reference value (e.g., value 731 in FIG. 9) except for two predetermined gross margin reference values (e.g., 702 and 762 in FIG. 9). The signals on the RFL BUS 614 not forced to a predetermined center reference value are used to ensure the gross sensing margins.

The CONTROL BUS 610 can instruct PRECISION SUMMER circuit block 608 and VR MUX 602 to force any predetermined subset of margin reference value signals on the RFL BUS 614 to a predetermined center reference value in order to store less than N bits per cell.

Alternatively, to store less than N bits per cell, the incoming serial data stream can be set to only utilize a subset of the $2^N$ levels. For instance, if cells fail to program adequately, the system may decide to utilize a predetermined number of levels adjacent to and including the erased level. An example of reducing N from 4 to 2 bits per cell storage is to use the 8 levels VL($2^N-1$) through VL($2^N-8$) instead of all 16 levels shown in FIG. 9. The SYSTEM MICROCONTROLLER 802 (FIG. 10) or a tester, or other control circuitry could control the proper incoming serial data coding, enabling the use of less than N bits per cell.

FIG. 11 is a circuit diagram showing the details of the PRECISION SUMMER circuit block 608 (FIG. 8) in accordance with a preferred embodiment of the present invention. A set of identical switched capacitor summers AZRxx 640 sums the voltage VMRGN provided by PRECISION MARGIN GENERATOR circuit block 612 (FIG. 8) on signal line 630 and the voltages VRIxx provided by VR MUX circuit block 602 (FIG. 8) on bus 625 (voltages VRIxx correspond to VRxx values in FIGS. 1–3 and 9). The output of the summers 640 forms RFL BUS 614. The RFLxx signal lines correspond to the inputs to REFERENCE MULTIPLEXER 50 in FIG. 5. The summers 640 are coupled to CONTROL BUS 610 for receiving a clocking signal AZ on line 644, a clocking signal AZB on line 642, an analog ground AGND on line 650, and analog power which is only shown when its application is not obvious. CONTROL BUS 610 additionally includes line 654 for providing a power down signal PD which couples directly to summers AZR1 through AZR14. The CONTROL BUS 610 also includes lines 641, 643, 645 for respectively providing signals RESTOREH, READ and RESTOREL, which together with signal PD are inputs to logic circuits shown as including four 2-input NAND gates and two inverters. The logic circuit provides output signals on lines 647 and 651 coupled to PD inputs of summers AZR0 and AZR15, respectively. CONTROL BUS 610 further includes a line 646 for providing a PBIAS signal coupled to an ANALOG BIAS CURRENT GENERATOR circuit block 635. Circuit block 635 generates a set of signals IBxx on lines 652 which couple to summers 640.

FIG. 12 shows a circuit diagram of one of the switched capacitor summers AZRxx 640 (FIG. 11) in accordance with a preferred embodiment of the present invention. In a preferred embodiment, the circuit of FIGS. 11 and 12 is implemented on a same multilevel memory chip.

Parameter and Redundancy Fuse Bits

The programming algorithm parameters previously mentioned, redundant column and/or row addresses, and other multilevel parameters such as margins and number of bits per cell can be stored in re-programmable storage elements called fuse bits, which may or may not be the same as the memory cells in the array. The number of such fuse bits can be quite large easily exceeding 64 but probably fewer than 1024 owing to the number of parameters and amount of redundancy needed for large multilevel memory arrays. The high degree of signal precision (on the order of a few millivolts) required for high N per bit (e.g., for N>2) multilevel operation makes it prudent to provide a degree of on-chip parameter adjustment ability to be able to offset process induced circuit parameter variations. Redundancy is used to repair bad cells or other array elements by replacing the defective element with a good element. Fuse bit circuits similar to the circuits storing the multilevel parameters can be used to store the information for the defective array elements as well as mapping the redundant elements in their place. The fuse bit circuits can be set during chip testing to configure the chip in an optimal condition to enhance reliability and to improve production yields.

Fuse bit setting can be accomplished in two ways. The fuse bits can be loaded into a fuse register, similar to a static RAM register, which can speed up testing. Or, after testing is completed or during convenient points in the test flow, the fuse bits can be programmed into their associated nonvolatile fuse cells. Programming and testing the nonvolatile fuse cells may be a long process in comparison to just loading the fuse register. Fuse bit circuits may need to be set into an initial configuration at the start of the test flow otherwise the on-chip state machine or multilevel operation may not function properly. Fuse bit settings can be adjusted on a chip basis as in the case of redundancy fusing, or on a lot basis to set multilevel parameters to adjust for processing changes effecting most of the wafers in a wafer lot, or any combination of the above. Fuse bit settings can be performed by the tester as part of the automated test flow, or in a manual fashion after product engineering evaluation of a representative sample of chips, or again, any combination of the above.

Other Multilevel Test Modes

Test modes may be required to be able to pass various multilevel parameters or important circuit values directly or indirectly from the chip to the tester. This can be used to speed up testing. For instance, it could be a waste of test time to execute a long mass mode-programming test before testing to determine if the on-chip high voltage programming generator circuit block is working properly. Another example may be to read out an important fuse bit adjustable circuit signal before setting the final fuse bit value.

Alternative test modes may be required to be able to pass various multilevel parameters or important circuit values directly or indirectly from the tester to the chip to temporarily force or override normal chip settings. An example of such a test mode is the stress test to uncover unreliable cell $V_R$ drift. Such a test could for instance couple the rows together and force a higher than normal operating value on the gate lines of the cells simultaneously. Such a stress test has been used before to screen for reliability but not in conjunction with tight margin testing as described previously.

As discussed throughout this specification, multilevel test modes of the invention are designed to be able to be used in various combinations to provide the flexible tools necessary to efficiently test multilevel memory chips.

While various preferred and alternate embodiments of the present invention have been disclosed and described in detail, it should be evident that the present invention is equally applicable by making appropriate modifications to the embodiments described above. In other instances, well-known electrical structures and circuits are shown in block diagram form in order not to unnecessarily obscure the present invention. Therefore, the above description should not be taken as limiting the scope of invention which is defined by the metes and bounds of the appended claims.

What is claimed is:

1. A method for testing a multilevel memory, the method comprising:

performing an erase operation to place a plurality of memory cells in an erased state;

programming a state of each cell in a group of the plurality of cells to within a first range of voltages;

if a state of each of one or more of the cells in the group of cells does not verify to within the first range of voltages, identifying at least the one or more cells as failing;

if a state of each cell in the group of cells verifies to within the first range of voltages:

applying a predetermined number of programming pulses to further program the state of each cell in the group of cells to within a second range of voltages; and verifying whether a state of each cell in the group of cells is programmed beyond the second range of voltages.

2. The method of claim 1 further comprising:
if a state of each of one or more cells in the group of cells is programmed beyond the second range of voltages, identifying at least the one or more cells as failing.

3. The method of claim 1 wherein the verifying step comprises:
comparing a sensing voltage generated by each of the further programmed cells to a preselected one of a plurality of reference voltages, the preselected reference voltage corresponding to the second range of voltages.

4. The method of claim 1 wherein the step of programming to within a first range of voltages is performed in accordance with an iterative verify-program routine.

5. The method of claim 1 wherein if a state of each cell in the group of cells verifies to within the first range of voltages, no verify operation is performed before or during the applying step.

6. The method of claim 1 further comprising:
if a state of each cell in the group of cells verifies to within the first range of voltages:
prior to the applying step, overriding a verify operation in an iterative verify-program routine; and
after the applying step, enabling the verify operation.

7. The method of claim 1 wherein the verifying step comprises:
identifying cells whose state fall short of the second range due to slow programming as passing.

8. The method of claim 1 wherein each of the predetermined number of programming pulses causes a sensing voltage generated by each cell in the group of memory cells to shift by a predetermined amount.

9. The method of claim 1 wherein the multilevel memory is a nonvolatile memory and is an integrated circuit.

10. The method of claim 1 wherein the cells in the group of cells are tested simultaneously to identify the cells which exhibit overshoot or aliasing.

11. The method of claim 1 wherein the first range and the second range are two of a plurality of sequentially defined voltage ranges which start with an initial range corresponding to the erased state, the identifying step comprising:
reconfiguring the plurality of sequentially defined voltage ranges such that the first range in not used in all subsequent operations for at least the one or more cells.

12. The method of claim 2 wherein the first range and the second range are two of a plurality of sequentially defined voltage ranges which start with an initial range corresponding to the erased state, the identifying step after the applying step comprises:
reconfiguring the plurality of sequentially defined voltage ranges such that the second range is not used in all subsequent memory operations for at least the one or more cells.

13. The method of claim 2 wherein each of the identifying steps comprises:
storing an address of each of the one or more cells; and
avoiding the address of the one or more cells in accessing the multilevel memory.

14. The method of claim 2 wherein each of the identifying steps comprises:
identifying as defective one or more pre-defined sectors of cells which include the one or more cells.

15. The method of claim 2 wherein each of the identifying steps comprises:
storing an address of each of one or more predefined sectors of cells which include the one or more cells; and
avoiding the address of the one or more sectors of cells in accessing the multilevel memory.

16. The method of claim 15 wherein the avoiding step comprises:
mapping out the address of the one or more sectors of cells from a system's memory space.

17. The method of claim 2 wherein each of the identifying steps comprises:
invoking redundancy to replace at least the one or more cells in the group of cells with redundant cells.

18. The method of claim 1 wherein the first range and the second range are two of a plurality of sequentially defined voltage ranges which start with an initial range corresponding to the erased state, the first range being the next range from the initial range.

19. The method of claim 1 wherein the first range and the second range are two of a plurality of sequentially defined voltage ranges which start with an initial range corresponding to the erased state, the first range being one of a first group of the plurality of sequentially defined voltage ranges substantially close to the initial range.

20. The method of claim 19 wherein the second range is one of a second group of the plurality of sequentially defined voltage ranges substantially close to the first range.

21. The method of claim 19 wherein the second range is the next range from the first range.

22. The method of claim 19 wherein a distribution of sensing voltages corresponding to the first range is narrower than a distribution of sensing voltages corresponding to the second range, the sensing voltages being generated by the group of cells.

23. The method of claim 19 wherein each of the plurality of sequentially defined voltage ranges corresponds to one of a plurality of distributions of sensing voltages generated by the memory cells.

24. The method of claim 23 wherein each sensing voltage is generated by a selected memory cell on a column line to which the selected cell is coupled.

25. The method of claim 23 wherein each of the plurality of sequentially defined voltage ranges is within a corresponding larger range of voltages, each larger range corresponding to one of $2^N$ binary combinations of N bits of data capable of being stored in each cell, wherein N is a positive integer.

26. The method of claim 25 wherein each of the larger voltage ranges has a magnitude less than 150 mV.

27. The method of claim 25 wherein N is greater than 2.

28. The method of claim 25 wherein the larger ranges are non-overlapping.

29. The method of claim 25 wherein each of the predetermined number of programming pulses causes a sensing voltage generated by each cell in the group of memory cells to shift by a predetermined amount.

30. The method of claim 29 wherein the first voltage range, the second voltage range, and the voltage ranges between the first and second voltage ranges have substantially equal magnitudes M1.

31. The method of claim 30 wherein the predetermined amount of sensing voltage shift is less than M1.

32. The method of claim 31 wherein the larger range corresponding to the first voltage range, and the larger range corresponding to the second voltage range, and the larger ranges corresponding to the voltage ranges between the first and second voltage ranges have substantially equal magnitudes M2.

33. The method of claim 32 wherein the predetermined number of programming pulses substantially equals M2 divided by the predetermined amount of sensing voltage shift if the second range is the next range from the first range.

34. The method of claim 32 wherein the second range is at least two ranges away from the first range.

35. The method of claim 34 wherein the predetermined number of programming pulses substantially equals the number of ranges the second range is away from the first range multiplied by M2 divided by the predetermined amount of sensing voltage shift.

36. The method of claim 32 wherein if the second range is the next range from the first range and the first range has a smaller magnitude than the second range then the predetermined number of programming pulses is substantially equal to M2 plus the difference between the magnitude of the second range and the magnitude of the first range, all divided by the predetermined amount of sensing voltage shift.

37. A method of testing a multilevel memory, the method comprising:

performing an erase operation to place a plurality of memory cells in an erased state;

programming a state of each cell in a group of the plurality of cells to within a first range of voltages;

if a state of each of one or more of the cells in the group of cells does not verify to within the first range of voltages, identifying at least the one or more cells as failing;

if a state of each cell in the group of cells verifies to within the first range of voltages:

overriding a verify operation in an iterative verify-program routine;

applying a predetermined number of programming pulses to further program the state of each cell in the group of cells to within a second range of voltages; and enabling the verify operation in the iterative verify-program routine;

verifying whether a state of each cell in the group of cells is programmed beyond the second range of voltages; and if a state of each of one or more cells in the group of cells is programmed beyond the second range of voltages, identifying at least the one or more cells as failing.

38. The method of claim 37 wherein the verifying step comprises:

comparing a sensing voltage generated by each of the further programmed cells to a preselected one of a plurality of reference voltages, the preselected reference voltage corresponding to the second range.

39. The method of claim 37 wherein the programming step is performed in accordance with the iterative verify-program routine.

40. The method of claim 37 wherein the multilevel memory is a nonvolatile memory and is an integrated circuit.

41. The method of claim 37 wherein the programming step further comprises:

comparing a sensing voltage generated by each of the programmed cells to a preselected pair of a plurality of reference voltages, the preselected pair of reference voltages corresponding to the first range.

42. The method of claim 37 wherein the first range and the second range are two of a plurality of sequentially defined voltage ranges which start with an initial range corresponding to the erased state, the first range being the next range from the initial range.

43. The method of claim 42 wherein each of the plurality of sequentially defined voltage ranges corresponds to one of a plurality of distributions of sensing voltages generated by the memory cells, each of the plurality of sequentially defined voltage ranges being within a corresponding larger range of voltages, each larger range corresponding to one of $2^N$ binary combinations of N bits of data capable of being stored in each cell, N being a positive integer, and the larger ranges being non-overlapping.

44. The method of claim 43 wherein each of the predetermined number of programming pulses causes a sensing voltage generated by each cell in the group of memory cells to shift by a predetermined amount, the sequentially defined voltage ranges having substantially equal magnitudes M1, the predetermined amount of sensing voltage shift being less than M1, a predetermined number of the larger ranges having substantially equal magnitudes M2.

45. The method of claim 43 wherein each of the larger voltage ranges has a magnitude less than 150 mV.

46. The method of claim 43 wherein N is greater than 2.

47. A method for detecting aliasing and overshoot in programming multilevel memory cells, the method comprising:

providing a plurality of sequentially defined voltage ranges which start with an initial range corresponding to an erased state, and a last range corresponding to a highest programmed state; and applying a predetermined number of programming pulses to a plurality of cells to change a state of the cells from a first range of the sequentially defined voltage ranges other than the initial range to a second range of the sequentially defined voltage ranges.

48. The method of claim 47 wherein no verify operation is performed immediately before or during the applying step.

49. The method of claim 47 wherein each of the plurality of sequentially defined voltage ranges has a magnitude less than 150 mV.

50. The method of claim 47 wherein the multilevel memory is a nonvolatile memory and is an integrated circuit.

51. A method for testing multilevel memory, the method comprising:

defining a plurality of sequentially defined voltage ranges which start with an initial range corresponding to an erased state and a last range corresponding to a highest programmed state;

identifying one or more memory cells failing to properly function in a target voltage range; and reconfiguring the plurality of sequentially defined voltage ranges such that the target voltage range is not used in any subsequent memory operations for at least the one or more cells.

52. The method of claim 51 wherein the identifying step comprises:

identifying one or more memory cells which: (a) fail to maintain stored charge in accordance with predefined criteria, or (b) upon applying a predetermined set of programming parameters program to a state corresponding to a voltage range beyond a target voltage range, or (c) upon applying a predetermined set of programming parameters fail to reach a state corresponding to a target voltage range, or (d) fail to properly erase from a target voltage range.

53. The method of claim 51 wherein each of the plurality of voltage ranges corresponds to one of $2^N$ binary combinations of N bits of data capable of being stored in memory cells, wherein N is a positive integer.

54. The method of claim 53 wherein the reconfiguring step comprises:
reducing the number of data bits capable of being stored in at least the one or more cells to an integer less than N.

55. The method of claim 53 wherein N is greater than 2.

56. The method of claim 51 wherein each of the plurality of sequentially defined voltage ranges has a magnitude less than 150 mV.

57. The method of claim 51 wherein the multilevel memory is a nonvolatile memory and is an integrated circuit.

58. A method for testing a multilevel memory, the memory having an array of erased memory cells arranged along rows and columns, each cell being capable of storing N bits of data by setting a state of each cell to within one of $2^N$ voltage ranges, the cells along each row being divided into M groups, each of the M groups having a plurality of adjacent memory cells, N and M being integers greater than 1, wherein in a memory access one of a plurality of pages of memory cells in a row is selected, each page having M memory cells, one cell from each of the M groups of cells, a subset of each page of M memory cells comprising $2^N$ cells, the method comprising:

(a) programming a state of each cell in a first group of $2^N$ cells located along each column to a respective one of the $2^N$ voltage ranges; and (b) programming a state of each cell in a second group of cells comprising the $2^N$ cells in the subset of a selected page along each row, each of the $2^N$ cells in the subset of the selected page along each row being programmed to a respective one of the $2^N$ voltage ranges.

59. The method of claim 58 further comprising:
programming a state of each of $2^N$ reference cells along each row to a respective one of the $2^N$ voltage ranges; and
comparing a state of each of the $2^N$ cells in the subset of the selected page along each row to a state of a corresponding one of the $2^N$ reference cells along the same row.

60. The method of claim 58 wherein each of the M groups of cells comprises K adjacent memory cells, there being K pages of memory cells along each row, the method further comprising:
programming a state of each of the $2^N$ cells in the subset of each of the K pages along each row to a respective one of the $2^N$ voltage ranges.

61. The method of claim 60 wherein the multilevel memory further comprises K groups of reference cells along each row, each of the K groups of reference cells comprising $2^N$ reference cells, the method further comprising:
programming a state of each of the $2^N$ reference cells in each of the K groups of reference cells along each row to a respective one of the $2^N$ voltage ranges; and
comparing a state of each of the $2^N$ cells in each of the K subsets along each row to a state of a corresponding one of the $2^N$ reference cells in each of the K groups of reference cells along the same row.

62. The method of claim 58 wherein the first group of cells are located substantially along a first side of the array furthest from a column select circuit coupled to the columns, and the second group of cells are located substantially along a second side of the array furthest from a row select circuit coupled to the rows.

63. The method of claim 58 wherein the cells in the first group of $2^N$ cells located along each column are adjacent one another.

64. The method of claim 58 wherein in steps (a) and (b) no two adjacent cells along each row are programmed to a same voltage range.

65. The method of claim 58 wherein in steps (a) and (b) no two adjacent cells along each column are programmed to a same voltage range.

66. The method of claim 58 further comprising:

(c) programming a state of each cell in a third group of $2^N$ cells located along each column to a respective one of the $2^N$ voltage ranges, the third group of cells being located along a third side of the array substantially close to a column select circuit coupled to the columns; and (d) programming a state of each cell in a fourth group of cells comprising $2^N$ cells in a subset of a selected page along each row, each of the $2^N$ cells in a subset of a selected page along each row in the fourth group being programmed to a respective one of the $2^N$ voltage ranges, the fourth group of cells being located along a fourth side of the array substantially close to a row select circuit coupled to the rows.

67. The method of claim 66 further comprising:
programming a state of each of the $2^N$ cells in the subset of each of the plurality of pages along each row in each of the second and fourth groups of cells to a respective one of the $2^N$ voltage ranges.

68. The method of claim 66 further comprising:
partially programming the remaining erased cells in the array of cells in accordance with a programming pattern as defined by steps (a), (b), (c), and (d).

69. The method of claim 58 wherein the $2^N$ voltage ranges are sequentially defined between a first voltage range corresponding to an erased state and a $2^N$ voltage range corresponding to a highest programmed state.

70. The method of claim 58 wherein each of the $2^N$ voltage ranges corresponds to one of $2^N$ binary combinations of the N bits of data.

71. The method of claim 58 further comprising:
partially programming the remaining erased cells in the array of cells in accordance with a programming pattern as defined by steps (a) and (b).

72. The method of claim 58 further comprising:
programming at least a portion of the remaining erased cells in the array of cells using a reduced value of N.

73. The method of claim 58 further comprising:
identifying cells failing to program in accordance with steps (a) and (b); and
programming a section or all of the remaining erased cells in the array of cells based on a number of failing cells identified in the identifying step.

74. The method of claim 58 wherein the multilevel memory is a nonvolatile memory and is an integrated circuit.

75. The method of claim 58 wherein each of the $2^N$ voltage ranges has a magnitude less than 150 mV.

76. The method of claim 58 wherein N is greater than 2.

77. A method for testing a multilevel memory having an array of erased memory cells, each cell being capable of storing N bits of data by setting a state of the cell to within one of $2^N$ voltage ranges, each of the $2^N$ voltage ranges comprising a distribution voltage range and at least one margin voltage range, N being an integer greater than 1, the method comprising:
programming a state of each of a plurality of the memory cells to within the distribution voltage range of at least one of the $2^N$ voltage ranges;
sensing the state of each of the plurality of programmed memory cells; and identifying any of the programmed memory cells whose state resides within the at least one margin voltage range, wherein a magnitude of the at least one margin voltage range is adjustable.

78. The method of claim 77 wherein the memory is an integrated circuit, the method further comprising:

internally generating a plurality of predefined margin voltage values used to define a magnitude of the at least one margin voltage range of each of the $2^N$ voltage ranges; and externally selecting at least one of the plurality of predefined margin voltage values for defining a magnitude of at least one margin voltage range of at least one of the $2^N$ voltage ranges.

79. The method of claim 78 wherein the internally generated plurality of predefined margin voltage values are adjustable.

80. The method of claim 78 further comprising:

storing the externally selected one of the plurality of predefined margin voltage values in a storage element.

81. The method of claim 80 wherein the externally selected one of the plurality of predefined margin voltage values is stored as binary data.

82. The method of claim 77 further comprising:

replacing any cell identified in the identifying step with redundant memory cells.

83. The method of claim 77 further comprising:

reducing the number of data items N stored in any cells identified in the identifying step.

84. The method of claim 77 further comprising:

reconfiguring the $2^N$ voltage ranges such that one or more of the voltage ranges to which any cells identified in the identifying step were programmed are not used in all subsequent memory operations.

85. The method of claim 77 further comprising:

storing status information indicating whether any cells were identified in the identifying step.

86. The method of claim 85 wherein the sensing step corresponds to a normal memory read operation, the method further comprising:

interrogating the status information; and executing a restore operation to restore the state of any cells identified in the identifying step to its original distribution range if the status information indicates that one or more cells were identified in the identifying step.

87. The method of claim 77 wherein the memory is an integrated circuit, the method further comprising:

storing address information of any cells identified in the identifying step in an internal storage element.

88. The method of claim 77 wherein the memory is an integrated circuit, the method further comprising:

storing address information of any cells identified in the identifying step in an external storage element.

89. The method of claim 77 wherein each of the $2^N$ voltage ranges comprises an upper-margin voltage range and a lower-margin voltage range, the method comprising:

identifying any of the programmed memory cells whose state resides within either the upper-margin voltage range or the lower-margin voltage range, wherein the upper-margin voltage range and the lower-margin voltage range of each of the $2^N$ voltage ranges are adjustable.

90. The method of claim 89 wherein the upper-margin voltage range, the distribution voltage range, and the lower-margin voltage range are non-overlapping voltage ranges.

91. The method of claim 77 wherein the $2^N$ voltage ranges are sequentially defined between a first voltage range corresponding to an erased state and a $2^N$ voltage range corresponding to a highest programmed state.

92. The method of claim 77 wherein each distribution voltage range is defined by a distribution of sensing voltages corresponding to one binary combination of the N bits of data.

93. The method of claim 77 wherein each of the $2^N$ voltage ranges corresponds to one of $2^N$ binary combinations of the N bits of data.

94. The method of claim 77 wherein the $2^N$ voltage ranges are non-overlapping voltage ranges.

95. The method of claim 77 wherein the sensing step comprises:

comparing a sensing voltage generated by each of the plurality of programmed memory cells on a corresponding column to which each cell is coupled to a preselected one of a plurality of reference voltages, the preselected reference voltage corresponding to the at least one margin voltage range, to indicate a state of the measured cell.

96. The method of claim 77 wherein the sensing step corresponds to a normal memory read operation, the method further comprising:

restoring the state of any cells identified in the identifying step to its original distribution range.

97. The method of claim 77 wherein each of the $2^N$ voltage ranges has a magnitude less than 150 mV.

98. The method of claim 77 wherein the multilevel memory is a nonvolatile memory and is an integrated circuit.

99. The method of claim 77 wherein N is greater than 2.

100. A method for testing a multilevel memory having an array of erased memory cells, each cell being capable of storing N bits of data by setting a state of the cell to within one of $2^N$ voltage ranges, each of the $2^N$ voltage ranges comprising a distribution voltage range and at least one margin voltage range, N being an integer greater than 1, the method comprising:

setting the distribution voltage range of at least one of the $2^N$ voltage ranges to a smaller range than a corresponding distribution voltage range used during normal memory programming mode;

programming a state of each of a plurality of the memory cells to within the distribution voltage range of the at least one of the $2^N$ voltage ranges;

subjecting the plurality of programmed cells to stress conditions; and if a state of one or more of the programmed cells drifts a predetermined amount out of the smaller distribution voltage range, identifying the one or more of the programmed cells.

101. The method of claim 100 wherein the smaller distribution range is obtained by setting a magnitude of the at least one margin voltage range to be greater than a magnitude of the corresponding margin voltage range used during normal memory programming mode.

102. The method of claim 100 further comprising:

replacing any cell identified in the identifying step with redundant memory cells.

103. The method of claim 100 further comprising:

reducing the number of data items N stored in at least any cells identified in the identifying step.

104. The method of claim 100 further comprising:

reconfiguring the $2^N$ voltage ranges such that one or more of the voltage ranges to which any cells identified in the identifying step were programmed are not used in all subsequent memory operations.

105. The method of claim 100 wherein the multilevel memory is a nonvolatile memory and is an integrated circuit.

106. The method of claim 100 wherein each of the $2^N$ voltage ranges has a magnitude less than 150 mV.

107. The method of claim 100 wherein N is greater than 2.

108. The method of claim 100 wherein the memory is an integrated circuit, the predetermined amount corresponding to a tolerated-drift voltage range, the method further comprising:

internally generating a plurality of predefined tolerated-drift voltage values used to define a magnitude of the tolerated-drift voltage range of the at least one of the $2^N$ voltage ranges; and externally selecting at least one of the plurality of predefined tolerated-drift voltage values for defining a magnitude of the tolerated-drift voltage range of at least one of the $2^N$ voltage ranges.

109. The method of claim 100 further comprising:

storing the externally selected at least one of the plurality of predefined tolerated-drift voltage values in a storage element.

110. The method of claim 109 wherein the externally selected one of the plurality of predefined margin voltage values is stored as binary data.

111. The method of claim 108 wherein the internally generated plurality of predefined tolerated-drift voltage values are adjustable.

112. The method of claim 108 wherein the smaller distribution voltage range, the at least one tolerated-drift voltage range, the at least one margin voltage range in the at least one of the $2^N$ voltage ranges are non-overlapping voltage ranges.

113. A method for testing a multilevel memory having an array of erased memory cells, each cell being capable of storing N bits of data by setting a state of the cell to within one of $2^N$ voltage ranges, N being an integer greater than 1, the method comprising:

dividing the $2^N$ voltage ranges into at least a first group of one or more voltage ranges and a second group of one or more voltage ranges;

programming a state of each of a plurality of the memory cells to within the second group of one or more voltage ranges;

sensing the state of each of the plurality of programmed memory cells; and identifying any of the programmed memory cells whose state resides within the first group of one or more voltage ranges as failing.

114. The method of claim 113 wherein the $2^N$ voltage ranges are sequentially defined between a first voltage range corresponding to an erased state and a $2^N$ voltage range corresponding to a highest programmed state.

115. The method of claim 114 further comprising:

generating a plurality of reference voltages for uniquely identifying each of the $2^N$ voltage ranges; and forcing all the plurality of reference voltages to be equal to a mid-reference voltage between the first voltage range and the $2^N$ voltage range.

116. The method of claim 114 wherein the dividing step comprises:

generating a mid-reference voltage, the mid-reference voltage being substantially near a center of the sequentially defined $2^N$ voltage ranges, voltage ranges above the mid-reference voltage corresponding to the first group of one or more voltage ranges, and voltage ranges below the mid-reference voltage corresponding to the second group of one or more voltage ranges.

117. The method of claim 116 further comprising:

generating a plurality of reference voltages for uniquely identifying each of the $2^N$ voltage ranges; and forcing all the plurality of reference voltages to be equal to the mid-reference voltage.

118. The method of claim 114 wherein the dividing step comprises:

generating a mid-reference voltage, the mid-reference voltage being substantially near the $2^N$ voltage range, voltage ranges above the mid-reference voltage corresponding to the first group of one or more voltage ranges, and voltage ranges below the mid-reference voltage corresponding to the second group of one or more voltage ranges.

119. The method of claim 118 further comprising:

generating a plurality of reference voltages for uniquely identifying each of the $2^N$ voltage ranges; and forcing all the plurality of reference voltages to be equal to the mid-reference voltage.

120. The method of claim 114 further comprising:

generating a first reference voltage and a second reference voltage dividing the $2^N$ voltage ranges into three groups of voltage ranges, a first one of the three groups of voltage ranges corresponding to the first group of one or more voltage ranges and being between the first and second reference voltages, a second one of the three groups of voltage ranges corresponding to the second group of one or more voltage ranges and being below the second reference voltage, a third one of the three groups of voltage ranges being above the first reference voltage.

121. The method of claim 120 wherein the sensing step comprises N or more sensing cycles, the method further comprising:

generating a plurality of reference voltages for uniquely identifying each of the $2^N$ voltage ranges;

during a plurality of the N or more sensing cycles, forcing the plurality of reference voltages to be equal to a mid-reference voltage between the first voltage range and the $2^N$ voltage range;

during one of a remaining sensing cycles, forcing one of the plurality of reference voltages to be equal to the first reference voltage; and during another of the remaining sensing cycles, forcing another of the plurality of reference voltages to be equal to the second reference voltage.

122. The method of claim 120 wherein the first one of the three groups of voltage ranges comprises a substantially fewer number of the $2^N$ voltage ranges than each of the second one and third one of the three groups of voltage ranges.

123. The method of claim 120 wherein the first one of the three groups of voltage ranges comprises a substantially greater number of the $2^N$ voltage ranges than the second one and third one of the three groups of voltage ranges.

124. The method of claim 123 wherein the third one of the three groups of voltage ranges comprises the voltage range corresponding to the erased state, the second one of the three groups of voltage ranges comprises the voltage range corresponding to the $2^N$ voltage range, and the first one of the three groups of voltage ranges comprises all the remaining $2^N$ voltage ranges.

125. The method of claim 113 wherein the multilevel memory is a nonvolatile memory and is an integrated circuit.

126. The method of claim 113 wherein each of the $2^N$ voltage ranges has a magnitude less than 150 mV.

127. The method of claim 113 wherein N is greater than 2.

128. A multilevel memory comprising:
- an array of memory cells each being capable of storing N bits of data by setting a state of the cell to within one of $2^N$ voltage ranges, N being an integer greater than 1; and
- a first circuit configured to receive a plurality of reference voltages and one of a plurality of predefined margin sensing voltages, the plurality of reference voltages uniquely identifying each of the $2^N$ voltage ranges, the first circuit performing an arithmetic operation on the reference voltages and the one of the plurality of predefined margin sensing voltages, and providing a modified plurality of reference voltages for use in sensing operations.

129. The memory of claim 128 wherein the sensing operation corresponds to a read operation or a programming-verify operation.

130. The memory of claim 128 wherein the first circuit adds the one of the plurality of predefined margin sensing values to each of the plurality of reference voltages.

131. The memory of claim 128 wherein the first circuit subtracts the one of the plurality of predefined margin sensing values from each of the plurality of reference voltage levels.

132. The memory of claim 128 further comprising:
- a reference voltage generator configured to generate the plurality of reference voltages; and
- a precision margin generator configured to generate the one of the plurality of predefined margin sensing voltage values.

133. The memory of claim 132 wherein the reference voltage generator further comprises:
- a reference circuit for generating a first set of reference voltages;
- a plurality of reference memory cells for generating a second set of reference voltages; and
- a multiplexer for selecting one of the first and second sets of reference voltages as the plurality of reference voltages for transfer to the first circuit.

134. The memory of claim 133 wherein the multiplexer is configured to force a predetermined number of the selected one of the first and second sets of reference voltages to a predetermined subset of the selected one of the first and second sets of reference voltages.

135. The memory of claim 128 wherein the multilevel memory is a nonvolatile memory and is an integrated circuit.

136. The memory of claim 128 wherein each of the $2^N$ voltage ranges has a magnitude less than 150 mV.

137. The memory of claim 128 wherein N is greater than 2.

138. A multilevel memory comprising:
- an array of memory cells each being capable of storing N bits of data by setting a state of the cell to within one of $2^N$ voltage ranges, N being an integer greater than 1; and
- a first circuit configured to receive a plurality of reference voltages uniquely identifying each of the $2^N$ voltage ranges, the first circuit being capable of reconfiguring the plurality of reference voltages to reduce the $2^N$ voltage ranges to less than $2^N$ ranges so that the storage capability of each cell is reduced from storing N bits.

139. The memory of claim 138 wherein the first circuit is capable of reconfiguring the plurality of reference voltages so that the $2^N$ voltage ranges are reduced to a first voltage range corresponding to an erased state and a second voltage range corresponding to a programmed state.

140. The memory of claim 139 wherein the first circuit is capable of reducing the $2^N$ voltage ranges to the first and second voltage ranges by forcing all the plurality of reference voltages to be equal to one reference voltage level.

141. The memory of claim 138 wherein the first circuit reconfigures the plurality of reference voltages so that the $2^N$ voltage ranges is reduced to three voltage ranges, a first voltage range corresponding to an intermediate margin voltage range, a second voltage range corresponding to a programmed state, and a third voltage range corresponding to an erased state.

142. The memory of claim 138 wherein the first circuit reconfigures the plurality of reference voltages so that the 2 voltage ranges is reduced to three voltage ranges, a first voltage range corresponding to failing states, a second voltage range corresponding to a programmed state, and a third voltage range corresponding to an erased state.

143. The memory of claim 138 wherein the first circuit comprises:
- a second circuit for selecting one of a first set and a second set of reference voltages; and
- a third circuit configured to receive the selected one of the first and second sets of reference voltages and one of a plurality of predefined margin sensing voltages, the selected one of the first and second sets of reference voltages uniquely identifying each of the $2^N$ voltage ranges, the third circuit performing an arithmetic operation on the selected one of the first and second sets of reference voltages and the one of the plurality of predefined margin sensing voltages, and providing a modified plurality of reference voltages for use in sensing operations.

144. The memory of claim 143 wherein the second circuit is configured to force a predetermined number of the selected one of the first and second sets of reference voltages to a predetermined subset of the selected one of the first and second sets of reference voltages.

145. The memory of claim 143 wherein the third circuit is configured to force a predetermined number of the selected one of the first and second sets of reference voltages to a predetermined subset of the selected one of the first and second sets of reference voltages.

146. The memory of claim 138 wherein each of the $2^N$ voltage ranges has a magnitude less than 150 mV.

147. The memory of claim 138 wherein the multilevel memory is a nonvolatile memory and is an integrated circuit.

148. The memory of claim 138 wherein N is greater than 2.

* * * * *